United States Patent
Linke et al.

(10) Patent No.: US 10,059,844 B2
(45) Date of Patent: Aug. 28, 2018

(54) METAL AZO PIGMENTS

(71) Applicant: LANXESS Deutschland GmbH, Cologne (DE)

(72) Inventors: Frank Linke, Cologne (DE); Hans-Ulrich Borst, Elsdorf (DE); Sabine Endert, Wuppertal (DE)

(73) Assignee: LANXESS Deutschland GmbH, Cologne (DE)

( * ) Notice: Subject to any disclaimer, the term of this patent is extended or adjusted under 35 U.S.C. 154(b) by 0 days.

(21) Appl. No.: 15/463,174

(22) Filed: Mar. 20, 2017

(65) Prior Publication Data

US 2017/0275468 A1  Sep. 28, 2017

(30) Foreign Application Priority Data

Mar. 23, 2016 (EP) .................... 16161854

(51) Int. Cl.
| | | |
|---|---|---|
| C09B 45/18 | (2006.01) |
| C09B 45/48 | (2006.01) |
| C08K 5/00 | (2006.01) |
| C09D 11/037 | (2014.01) |
| C09D 11/322 | (2014.01) |
| G02B 5/22 | (2006.01) |
| G02F 1/1335 | (2006.01) |
| G03F 7/00 | (2006.01) |
| G03F 7/004 | (2006.01) |
| G03F 7/028 | (2006.01) |
| G03F 7/16 | (2006.01) |
| G03F 7/20 | (2006.01) |
| G03F 7/32 | (2006.01) |
| C09B 45/22 | (2006.01) |
| C09B 67/04 | (2006.01) |
| C09B 67/48 | (2006.01) |
| C09B 67/22 | (2006.01) |
| C09D 7/41 | (2018.01) |

(52) U.S. Cl.
CPC .......... *C09B 45/485* (2013.01); *C08K 5/0091* (2013.01); *C09B 45/18* (2013.01); *C09B 45/22* (2013.01); *C09B 45/48* (2013.01); *C09B 67/0002* (2013.01); *C09B 67/0029* (2013.01); *C09B 67/0051* (2013.01); *C09D 7/41* (2018.01); *C09D 11/037* (2013.01); *C09D 11/322* (2013.01); *G02B 5/223* (2013.01); *G02F 1/133516* (2013.01); *G03F 7/0007* (2013.01); *G03F 7/0042* (2013.01); *G03F 7/028* (2013.01); *G03F 7/16* (2013.01); *G03F 7/2004* (2013.01); *G03F 7/32* (2013.01)

(58) Field of Classification Search
CPC ......... C09B 45/14; C09B 45/16; C09B 45/18; C09B 45/20; C09B 29/3665; C09B 67/0051; C08K 5/0091; G02B 5/223; G02F 1/133514; G02F 1/133516; G03F 7/0007; G03F 7/029; G03F 7/105; C09D 11/037; C09D 17/003
USPC ................ 430/7; 349/106; 534/602, 707
See application file for complete search history.

(56) References Cited

U.S. PATENT DOCUMENTS

| | | |
|---|---|---|
| 6,350,307 B1 | 2/2002 | Linke et al. |
| 7,255,737 B2 | 8/2007 | Feldhues et al. |
| 8,932,786 B2 | 1/2015 | Borst et al. |
| 2002/0034696 A1* | 3/2002 | Wolf ..................... C09B 45/14 430/7 |

FOREIGN PATENT DOCUMENTS

JP          11217514 A2     8/1999

OTHER PUBLICATIONS

Herbst, Willy, et al., Industrial Organic Pigments, 2004, Wiley-VCH, pp. 390-397.
Zorll, Ulrich, Rompp Lexikon, Lacke and Druckfarben, Photoinitiatoren, Georg Thieme Verlag, 1998, pp. 491-492.
Zorll, Ulrich, Rompp Lexikon, Lacke and Druckfarben, Recycling, Georg Thieme Verlag, 1998, pp. 445-446.
European Search Report from European Application No. 17158626, dated Jun. 20, 2017, two pages.

* cited by examiner

Primary Examiner — John A McPherson

(57) ABSTRACT

The novel yellow metal azo pigments based on at least two metal azo compounds which differ at least in the type of metal have both improved dispersion properties and improved color strengths and are of excellent suitability for pigmentation of pigment preparations for a broad field of use.

19 Claims, No Drawings

METAL AZO PIGMENTS

The present invention relates to novel yellow metal azo pigments based on at least two metal azo compounds which differ at least in the type of metal, to processes for production thereof and to the use thereof as yellow pigment in pigment preparations.

BACKGROUND INFORMATION

The preparation of metal complexes from azobarbituric acid with nickel salts and the use thereof as yellow pigments has long been known and has been described many times in the literature (cf., for example, W. Herbst, K. Hunger: Industrial Organic Pigments, 3rd edition 2004, p. 390/397). It is additionally known that these products can be reacted further, for example with melamine or melamine derivatives, in order to improve the performance properties of the pigments, for example in the colouring of plastics, lacquers and colour filters for LCDs.

In addition, literature states that colouristic properties can also be adjusted using, apart from nickel salts, one or more salts of different metals as well. The application EP-A 1 591 489 describes metal complexes of azo compounds containing, as metals, those from the group of the alkali metals, alkaline earth metals, the lanthanoids, and aluminium, scandium, titanium, vanadium, chromium, manganese, cobalt, copper, nickel and zinc, and optionally iron. The pigments obtained have a different colour locus compared to the pure nickel-azobarbituric acid complexes.

Controlled surface coverage of the metal azo pigment can likewise achieve an improvement in performance-based properties, specifically the lowering of the dispersion hardness as a measure of the dispersion properties of the pigment. However, this method of improving dispersibility is associated with a reduction in the colour intensity of the pigment, which is directly dependent on the concentration of covering agent.

A further means of adjusting performance-based properties is to subject the pigments produced from nickel-azobarbituric acid complexes with melamine, for example, to a heat treatment. This process step is associated with a controlled alteration in the particle size of the pigments and the specific surface area thereof. This process is described, for example, in EP-A 0 994 162.

However, the metal azo pigments known from the prior art are still in need of improvement with regard to the performance properties thereof.

Furthermore, for environmental reasons, there is the pressing desire to provide metal azo pigments having a minimum content of nickel ions or even entirely nickel-free products for these applications.

SUMMARY

It has been found that metal azo pigments based on azobarbituric acid, zinc salts, copper salts and melamine and/or melamine derivatives and at least one further metal salt other than zinc and copper salts surprisingly have improved dispersion properties with a simultaneous increase in the colour intensity. The improvement of these properties enables improved use of these products, inter alia, for colouring of plastics and lacquers, and for use in inkjets and as a component of colour filters for LCDs.

DESCRIPTION OF THE EMBODIMENTS

The invention therefore relates to metal azo pigments, characterized in that they comprise the following components:

a) at least two metal azo compounds which differ at least in the type of metal and which each contain structural units of the formula (I), or the tautomeric forms thereof,

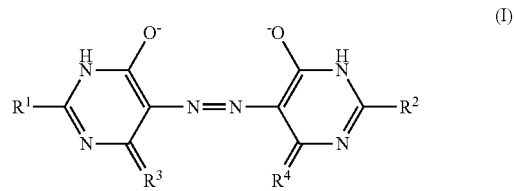

(I)

in which
$R^1$ and $R^2$ are each independently OH, $NH_2$ or $NHR^5$,
$R^3$ and $R^4$ are each independently $=O$ or $=NR^5$,
$R^5$ is hydrogen or alkyl, preferably $C_1$-$C_4$-alkyl,
and
$Zn^{2+}$ and/or $Cu^{2+}$ metal ions and optionally at least one further metal ion Me, where Me is a di- or trivalent metal ion other than $Zn^{2+}$ and $Cu^{2+}$, with the proviso that the amount of $Zn^{2+}$ and $C^{2+}$ metal ions together is 95 to 100 mol % and the amount of di- or trivalent metal ions other than $Zn^{2+}$ and $Cu^{2+}$ is 0 to 5 mol %, based in each case on one mole of all metal ions in the metal azo pigment,
where the molar ratio of $Zn^{2+}$ to $Cu^{2+}$ metal ions in the metal azo pigment is 199:1 to 1:15, preferably 19:1 to 1:1 and more preferably 9:1 to 2:1,
and
b) at least one compound of the formula (II)

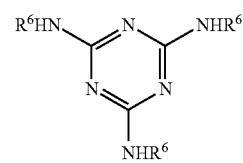

in which
$R^6$ is hydrogen or alkyl, preferably $C_1$-$C_4$-alkyl optionally mono- or polysubstituted by OH.
Preferably, in formula (I), $R^1$ and $R^2$ are each independently OH, $NH_2$ or $NHR^5$ where $R^5$ is hydrogen or $C_1$-$C_4$-alkyl.
Preferably, in formula (I), $R^3$ and $R^4$ are each independently $=O$ or $=NR^5$ where $R^5$ is hydrogen or $C_1$-$C_4$-alkyl.
More preferably, in formula (I), $R^1$ and $R^2$ are OH and $R^3$ and $R^4$ are $=O$.
Preferably, in formula (II), $R^6$ is hydrogen or $C_1$-$C_4$-alkyl optionally mono- or polysubstituted by OH. More preferably, in formula (II), $R^6$ is hydrogen.

Based on one mole of all metal ions present in the metal azo pigment, the amount of $Cu^{2+}$ and $Zn^{2+}$ ions together is generally 95 to 100 mol % and the amount of metal ions Me 0 to 5 mol %; the amount of $Cu^{2+}$ and $Zn^{2+}$ ions together is preferably 98 to 100 mol % and the amount of metal ions Me 0 to 2 mol %, the amount of $Cu^{2+}$ and $Zn^{2+}$ ions together is more preferably 99.9 to 100 mol % and the amount of metal ions Me 0 to 0.1 mol %, and the amount of $Cu^{2+}$ and $Zn^{2+}$ ions together is especially 100 mol %.

In general, the molar ratio of $Zn^{2+}$ to $Cu^{2+}$ metal ions in the metal azo pigment is 199:1 to 1:15, preferably 19:1 to 1:1 and more preferably 9:1 to 2:1.

Substituents in the definition of alkyl denote, for example, straight-chain or branched $C_1$-$C_6$-alkyl, preferably straight-chain or branched $C_1$-$C_4$-alkyl, which may optionally be mono- or polysubstituted identically or differently, for example by halogen such as chlorine, bromine or fluorine; —OH, —CN, —$NH_2$ or $C_1$-$C_6$-alkoxy.

The metal ions Me are preferably in their most stable oxidation states.

Preferably, Me is a metal ion selected from the group of $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, $Ba^{2+}$, more preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, most preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, $Sr^{2+}$ and especially from the group of $Al^{3+}$, $Fe^{2+}$, $Fe^{3+}$, $Co^{2+}$ and $Co^{3+}$.

In the case that the metal azo compounds of component a) contain divalent metal ions Me, the structural units of the formula (I) and the metal ions Me can be regarded as compounds of the formula (Ia)

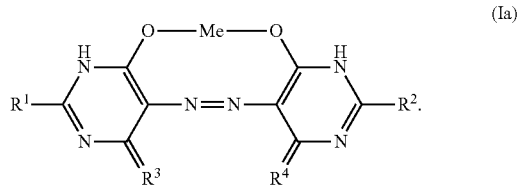

(Ia)

However, it is also possible that the metal ion is bonded via the nitrogen atoms in a tautomeric notation of the formula (Ia).

The same formula representation can also be applied to the structural units of the formula (I) with the $Cu^{2+}$ ions or with the $Zn^{2+}$ ions. This representation serves merely for illustration and does not make any claim to scientific correctness.

In the case that Me is a trivalent metal ion, the charge is balanced by an equivalent amount of anionic structural units of the formula (I).

Preferably, said charge of the doubly negatively charged structural units of the formula (I) is balanced to an extent of 80% to 100%, more preferably to an extent of 95% to 100% and most preferably to an extent of 99.9% to 100% by the sum total of all $Cu^{2+}$ and $Zn^{2+}$ present in the metal azo pigment and any further metal ions Me.

Preferably, said metal azo compounds of components a) form adducts with components b), i.e. the compounds of the formula (II).

Adducts are understood to mean molecular assemblies in general. The bond between the molecules here may be the result, for example, of intermolecular interactions or Lewis acid-base interactions or of coordinate bonds.

The term "adduct" in the context of the present invention shall generally encompass all kinds of intercalation and addition compounds.

The terms "intercalation compound" or "addition compound" in the context of the present invention shall be understood, for example, to mean compounds which are formed on the basis of intermolecular interactions such as van der Waals interactions or else Lewis acid-base interactions. The way in which the intercalation proceeds here depends both on the chemical properties of the component to be intercalated and on the chemical nature of the host lattice. Compounds of this kind are frequently also referred to as intercalation compounds. In a chemical sense, this is understood to mean the intercalation of molecules and ions (less commonly atoms as well) into chemical compounds.

This shall additionally also be understood to mean inclusion compounds called clathrates. These are compounds of two substances, one of which is a guest molecule intercalated into a lattice or cage composed of a host molecule.

The terms "intercalation compound" or "addition compound" in the context of the present invention shall also be understood to mean mixed intercalation crystals (including interstitial compounds). These are chemical non-stoichiometric crystalline compounds composed of at least two elements.

In addition, the terms "intercalation compound" or "addition compound" in the context of the present invention shall also be understood to mean compounds which are formed on the basis of coordinate bonds or complex bonds. Compounds of this kind refer, for example, to mixed substitution crystals or mixed replacement crystals in which at least two substances form a common crystal and the atoms of the second component are at regular lattice sites of the first component.

Preference is given to metal azo pigments comprising the adducts of
a) at least two metal azo compounds which differ at least in the type of metal and which each contain structural units of the above-specified formula (I)
in which $R^1$ and $R^2$ are OH,
and
$R^3$ and $R^4$ are =O,
and
$Zn^{2+}$ and/or $Cu^{2+}$ metal ions and optionally at least one further metal ion Me,
where
Me is a metal ion selected from the group of $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, $Ba^{2+}$, more preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, most preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, $Sr^{2+}$ and especially from the group of $Al^{3+}$, $Fe^{2+}$, $Fe^{3+}$, $Co^{2+}$ and $Co^{3+}$.
with the proviso that the amount of $Zn^{2+}$ and $Cu^{2+}$ metal ions together is 95 to 100 mol % and the amount of metal ions Me is 0 to 5 mol %, based in each case on one mole of all metal ions in the metal azo pigment,
and
where the molar ratio of $Zn^{2+}$ to $Cu^{2+}$ metal ions in the metal azo pigment is 199:1 to 1:15,
preferably 19:1 to 1:1 and more preferably 9:1 to 2:1,
and
b) at least one compound of the above-specified formula (II)
in which
$R^8$ is hydrogen.

Particular preference is given to metal azo pigments comprising the adducts of a) at least two metal azo compounds which differ at least in the type of metal and which each contain structural units of the above-specified formula (I)
in which
$R^1$, $R^2$, $R^3$, $R^4$ and $R^5$ have the above-specified general and preferred definition, and
contain $Zn^{2+}$ and/or $Cu^{2+}$ metal ions,
with the proviso that the amount of $Cu^{2+}$ and $Zn^{2+}$ metal ions together is 100 mol %, based on one mole of all metal ions in the metal azo pigment,
and
where the molar ratio of $Zn^{2+}$ to $Cu^{2+}$ metal ions in the metal azo pigment is 199:1 to 1:15, preferably 19:1 to 1:1 and more preferably 9:1 to 2:1,
and
b) at least one compound of the above-specified formula (II) in which
$R^6$ has the above-specified general and preferred definitions.

Compounds suitable for forming an adduct in the sense of the above definition with the metal azo compounds of component a) may be either organic or inorganic compounds. These compounds are referred to hereinafter as adduct formers.

Adduct formers suitable in principle come from an extremely wide variety of different compound classes. For purely practical reasons, preference is given to those compounds which are solid or liquid under standard conditions (25° C., 1 bar).

Among the liquid substances, preference is generally given to those having a boiling point of 100° C. or higher, preferably of greater than or equal to 150° C. at 1 bar. Suitable adduct formers are generally acyclic and cyclic organic compounds, for example aliphatic and aromatic hydrocarbons which may be substituted, for example, by OH, COOH, $NH_2$, substituted $NH_2$, $CONH_2$, substituted $CONH_2$, $SO_2NH_2$, substituted $SO_2NH_2$, $SO_3H$, halogen, $NO_2$, CN, —$SO_2$-alkyl, —$SO_2$-aryl, —O-alkyl, —O-aryl, —O-acyl.

Carboxamides and sulphonamides are a preferred group of adduct formers; also especially suitable are urea and substituted ureas such as phenylurea, dodecylurea and others, and the polycondensates thereof with aldehydes, especially formaldehyde; heterocycles such as barbituric acid, benzimidazolone, benzimidazolone-5-sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1,3,5-triazine-2,4-diamine, cyanuric acid.

Likewise suitable in principle as adduct formers are polymers, preferably water-soluble polymers, for example ethylene-propylene oxide block polymers, preferably having an $M_n$ greater than or equal to 1000, especially from 1000 to 10 000 g/mol, polyvinyl alcohol, poly(meth)acrylic adds, modified cellulose such as carboxymethyl celluloses, hydroxyethyl and -propyl celluloses, methyl and ethyl hydroxyethyl celluloses.

According to the invention, the adduct formers used are those of the formula (II). Especially preferred here is melamine.

In general, the metal azo pigments of the invention contain 0.05 to 4 mol, preferably 0.5 to 2.5 mol and most preferably 1.0 to 2.0 mol of compounds of the formula (II) per mole of structural units of the formula (I).

The metal azo pigments of the invention preferably have a specific surface area ($m^2/g$) of 20 to 200 $m^2/g$, especially 60 to 160 $m^2/g$, most preferably 90 to 150 $m^2/g$. The surface area is determined in accordance with DIN 66131: determination of the specific surface area of solids by gas adsorption according to Brunauer, Emmett and Teller (B.E.T).

The metal azo pigments of the invention may be physical mixtures or chemical mixed compounds. Preferably, the physical mixtures are mixtures of adducts of said metal azo compounds of component a) and the compounds of the formula (II) of component b) which differ at least in terms of the type of metals. Preferred examples are the physical mixture of the adducts of a1) the pure Zn azo compound with b1) melamine and the adducts of a2) the pure Cu azo compound with b2) melamine and optionally the adducts of a3) with at least one further Me azo compound with b3) melamine. The chemical mixed compounds are, for example and with preference, adducts of metal azo compounds of component a) with compounds of the formula (II) of component b), preferably melamine, where the $Zn^{2+}$ and $Cu^{2+}$ ions, and any further metal ion Me, are incorporated into a common crystal lattice.

In the case of the present invention, there is no difference in the x-ray diffractograms of the physical mixtures and the chemical mixed compounds.

The metal azo pigments of the invention are notable for characteristic signals in the x-ray diffractogram. Especially in that the metal azo pigment has, in the x-ray diffractogram, between the interplanar spacings of d=14.7 (±0.3) Å and d=11.8 (±0.3) Å, at least one signal S having the intensity I which exceeds the background value by 3 times the square root of this value.

It is a feature of the metal azo pigments of the invention where the molar ratio of $Zn^{2+}$ to $Cu^{2+}$ metal ions in one mole of all metal ions is 1:15 to 4:1 that they have, in the x-ray diffractogram, at an interplanar spacing of d=12.3 (±0.3) Å, a signal $S_1$ having an intensity $I_1$ and, at the same time, at an interplanar spacing of d=3.7 (±0.3) Å, a signal $S_2$ having an intensity $I_2$, each exceeding the background value by 3 times the square root of this value.

The metal azo pigments of the invention can be prepared by reacting alkali metal salts of the formula (III), or tautomers thereof, preferably the sodium or potassium salts, in the presence of at least one compound of the formula (II), with zinc and copper salts and optionally one or more metal salts of di- or trivalent metals other than zinc and copper, preferably from the group of the nickel, aluminium, iron, cobalt, lanthanum, cerium, praseodymium, neodymium, samarium, europium, gadolinium, terbium, dysprosium, holmium, ytterbium, erbium, thulium, magnesium, calcium, strontium, manganese, yttrium, scandium, titanium, niobium, molybdenum, vanadium, zirconium, cadmium, chromium, lead and barium salts, more preferably from the group of the nickel, aluminium, iron, cobalt, lanthanum, cerium, praseodymium, neodymium, samarium, europium, gadolinium, terbium, dysprosium, holmium, ytterbium, erbium, thulium, magnesium, calcium, strontium, manganese and yttrium salts, and most preferably from the group of the nickel, aluminium, iron, cobalt, lanthanum, cerium, praseodymium, neodymium, samarium, terbium, holmium and strontium salts, and especially from the group of the nickel, aluminium, iron and cobalt salts.

The metal azo pigments of the invention can also be prepared by mixing the adducts of a1) metal azo compounds containing structural units of the formula (I) and $Zn^{2+}$ ions and b1) compounds of the formula (II) with adducts of a2) metal azo compounds containing structural units of the formula (I) and $Cu^{2+}$ ions and b2) compounds of formula (II), optionally with adducts a3) of metal azo compounds containing structural units of the formula (I) and metal ions Me and b3) compounds of the formula (II).

The present invention further provides a process for producing the metal azo pigments of the invention, which is characterized in that at least one compound of the formula (III), or tautomers thereof,

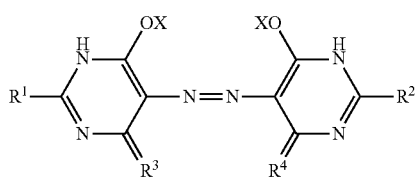
(III)

in which

X is an alkali metal ion, preferably a sodium or potassium ion, $R^1$ and $R^2$ are each independently OH, $NH_2$ or $NHR^5$, $R^3$ and $R^4$ are each independently =O or —$NR^5$, and $R^5$ is hydrogen or alkyl, preferably $C_1$-$C_4$-alkyl, in the presence of at least one compound of the formula (II), is reacted simultaneously or successively with at least one zinc salt and at least one copper salt and optionally with at least one further metal salt of a di- or trivalent metal other than zinc and copper, preferably from the group of the $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$ and $Ba^{2+}$ salts, more preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$ and $Y^{3+}$ salts, most preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$ and $Sr^{2+}$ salts and especially from the group of $Al^{3+}$, $Fe^{2+}$, $Fe^{3+}$, $Co^{2+}$ and $Co^{3+}$ salts, where 0.06 to 0.995 mol of at least one zinc salt, 0.005 to 0.94 mol of at least one copper salt and 0.05 to 0 mol of at least one further metal salt of di- or trivalent metals other than zinc and copper are used per mole of compound of the formula (III), and where the sum total of the molar amounts of all these metal salts together is one mole.

Preferably, 0.05 to 0.5 mol of at least one zinc salt and 0.49 to 0.95 mol of at least one copper salt and 0.01 to 0 mol of at least one further metal salt of di- or trivalent metals other than zinc and copper are used per mole of compound of the formula (III).

Most preferably, 0.1 to 0.3 mol of at least one zinc salt and 0.7 to 0.9 mol of at least one copper salt are used per mole of compound of the formula (III).

In general, the process of the invention is performed using 0.05 to 4 mol, preferably 0.5 to 2.5 mol and most preferably 1.0 to 2.0 mol of compound of the formula (II) per mole of compound of the formula (III).

Alternatively, for the preparation, instead of the di-alkali metal compound of the formula (III), it is also possible to use a mono-alkali metal compound of the formula (IIIa), or tautomers thereof,

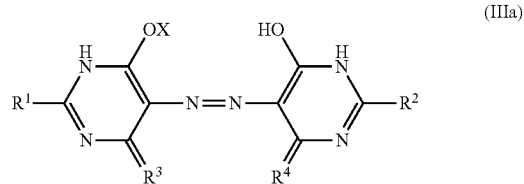
(IIIa)

in which X, $R^1$, $R^2$, $R^3$ and $R^4$ have the definition given for formula (III), or a mixture of compounds of the formula (III) and (IIIa). The stated molar amounts of zinc and copper salts and any further metal salts other than zinc and copper salts and of compounds of the formula (II) in these cases relate to the sum total of the molar amounts of the compounds (III) and (IIIa) used.

Especially preferred is the preparation of binary zinc/copper azobarbituric acid-melamine adducts. The process of the invention is generally conducted at a temperature of 60 to 95° C. in aqueous solution at a pH below 7. The zinc and copper salts for use in accordance with the invention and any further metal salts to be used can be used individually or as a mixture with one another, preferably in the form of an aqueous solution. The compounds of the formula (II) may likewise be added individually or as a mixture with one another, preferably in the form of the solids.

In general, the process of the invention is conducted in such a way that the azo compound of the formula (III), preferably as the sodium or potassium salt, is initially charged, that one or more compounds of the formula (II), preferably melamine, is/are added and then reaction is effected successively or simultaneously with at least one zinc salt and at least one copper salt and optionally one or more metal salts of di- or trivalent metals other than zinc and copper, preferably in the form of the aqueous solutions of these salts, preferably at pH values less than 7. Suitable substances for adjusting the pH are sodium hydroxide solution, potassium hydroxide solution, sodium carbonate, sodium hydrogencarbonate, potassium carbonate and potassium hydrogencarbonate.

Useful zinc and copper salts preferably include the water-soluble salts thereof, especially chlorides, bromides, acetates, formates, nitrates, sulphates, etc. Zinc and copper salts used with preference have a water solubility of more than 20 g/l, especially more than 50 g/l, at 20° C.

Useful further metal salts of di- or trivalent metals other than zinc and copper, preferably from the group of the nickel, aluminium, iron, cobalt, lanthanum, cerium, praseodymium, neodymium, samarium, europium, gadolinium, terbium, dysprosium, holmium, ytterbium, erbium, thulium, magnesium, calcium, strontium, manganese, yttrium, scandium, titanium, niobium, molybdenum, vanadium, zirconium, cadmium, chromium, lead and barium preferably include the water-soluble salts thereof, especially the chlorides, bromides, acetates, nitrates and sulphates thereof, preferably the chlorides thereof.

The metal azo pigments of the invention obtained in this way can then be isolated by filtration of the aqueous suspensions thereof as an aqueous filtercake. This filtercake, optionally after washing with hot water, can be dried by means of standard drying methods.

Useful drying methods include, for example, paddle drying or spray drying of corresponding aqueous slurries.

Subsequently, the pigment can be reground.

If the metal azo pigments of the invention have excessively hard grains or are too hard to be dispersed for the desired application, they can be converted to soft-grained pigments, for example by the method described in DE-A 19 847 586.

The present invention further provides a process for producing the metal azo pigments of the invention, which is characterized in that (I) at least one adduct of
  a1) a metal azo compound containing structural units of the above-specified formula (I)
    in which
    $R^1$, $R^2$, $R^3$, $R^4$ and $R^5$ have the above-specified general and preferred definition,
    and
    $Cu^{2+}$ ions,
    and
  b1) at least one compound of the above-specified formula (II) in which $R^6$ has the general and preferred definitions given above,
    and the amount of $Cu^{2+}$ metal ions is 100 mol %, based on one mole of all metal ions in the adduct a1)/b1),
with
(ii) at least one adduct of
  a2) a metal azo compound containing structural units of the above-specified formula (I) in which
    $R^1$, $R^2$, $R^3$, $R^4$ and $R^5$ have the above-specified general and preferred definition,
    and
    $Zn^{2+}$ ions,
    and
  b2) at least one compound of the above-specified formula (II) in which $R^6$ has the general and preferred definitions given above,
    and the amount of $Zn^{2+}$ metal ions is 100 mol %, based on one mole of all metal ions in the adduct a2)/b2),
    and optionally with
(iii) at least one adduct of
  a3) a metal azo compound containing structural units of the above-specified formula (I)
    in which
    $R^1$, $R^2$, $R^3$, $R^4$ and $R^5$ have the above-specified general and preferred definition,
    and
    metal ions Me,
    in which
    Me is a di- or trivalent metal ion other than $Zn^{2+}$ and $Cu^{2+}$, preferably a metal ion selected from the group of $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, $Ba^{2+}$,
    more preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, most preferably from the group of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, $Sr^{2+}$ and especially from the group of $Al^{3+}$, $Fe^{2+}$, $Fe^{3+}$, $Co^{2+}$ and $Co^{3+}$,
    and
  b3) at least one compound of the above-specified formula (II) in which $R^5$ has the general and preferred definitions given above,
    and the amount of Me metal ions is 100 mol %, based on one mole of all metal ions in the adduct a3)/b3),
are mixed with one another, where 0.005 to 15 mol of adduct a2)/b2) are used and 0 to 0.05 mol of adduct a3)/b3) are used per mole of adduct a1)/b1), based on the sum total of the molar amount of adducts a1)/b1) and a2)/b2).

Preference is given to the preparation of binary adduct mixtures, wherein 0.05 to 1 mol of adduct a2)/b2) are used per mole of adduct a1)/b1), preferably 0.1 to 0.5 mol of adduct a2)/b2) per mole of adduct a1)/b1).

The metal azo pigments of the invention are notable for particularly good dispersibility and a high colour intensity. Chroma and transparency have excellent adjustability.

The metal azo pigments of the invention are of excellent suitability for all pigment applications, especially also in the form of the pigment preparations thereof.

The present invention further provides pigment preparations comprising at least one metal azo pigment of the invention and at least one auxiliary and/or additive.

Useful auxiliaries or additives generally include all additions that are customary for pigment preparations, for example those from the group of the surface-active agents such as dispersants, surfactants, wetting agents, emulsifiers, and those from the group of the surface-covering agents, bases and solvents. In principle, the auxiliary or additive is guided by the nature of the target system. If the target system is, for example, a lacquer or a printing ink, the auxiliary or additive is then selected so as to achieve maximum compatibility with the target system.

Preferably, the pigment preparations of the invention comprise at least one surface-active agent.

Surface-active agents in the context of the present invention are especially understood to mean dispersants, which stabilize the pigment particles in their fine particulate form in aqueous media. "Fine particulate" is preferably understood to mean a fine distribution of 0.001 to 5 µm, especially of 0.005 to 1 µm, more preferably of 0.005 to 0.5 µm. The pigment preparation of the invention is preferably in fine particulate form.

Suitable surface-active agents are, for example, anionic, cationic, amphoteric or nonionic in nature.

Suitable anionic surface-active agents (c) are especially condensation products of aromatic sulphonic acids with formaldehyde, such as condensation products of formaldehyde and alkylnaphthalenesulphonic acids or of formaldehyde, naphthalenesulphonic acids and/or benzenesulphonic acids, condensation products of optionally substituted phenol with formaldehyde and sodium bisulphite. Also suitable are surface-active agents from the group of the sulphosuccinic esters and alkylbenzenesulphonates. Also ionically modified, especially sulphated or carboxylated, alkoxylated fatty acid alcohols or salts thereof. Alkoxylated fatty acid alcohols are especially understood to mean those $C_6$-$C_{22}$ fatty acid alcohols endowed with 5 to 120, preferably 5 to 60 and especially with 5 to 30 mol of ethylene oxide, which are saturated or unsaturated. Additionally useful are lignosulphonates in particular, for example those which are obtained by the sulphite or Kraft process. They are preferably products which are partially hydrolysed, oxidized, propoxylated, sulphonated, sulphomethylated or desulphonated and which are fractionated by known methods, for example according to the molecular weight or the degree of sulphonation. Mixtures of sulphite and Kraft lignosulphonates are also very effective. Especially suitable are lignosulphonates with an average molecular weight between 1000 and 100 000 g/mol, a content of active lignosulphonate of at least 80% by weight and, preferably, a low content of polyvalent cations. The degree of sulphonation can be varied within wide limits.

Examples of useful nonionic surface-active agents include: reaction products of alkylene oxides with compounds capable of being alkylated, such as, for example, fatty alcohols, fatty amines, fatty acids, phenols, alkylphenols, arylalkylphenols, such as styrene-phenol condensates, carboxamides and resin acids. These are, for example, ethylene oxide adducts from the class of the reaction products of ethylene oxide with:
1) saturated and/or unsaturated fatty alcohols having 6 to 22 carbon atoms or
2) alkylphenols having 4 to 12 carbon atoms in the alkyl radical or
3) saturated and/or unsaturated fatty amines having 14 to 20 carbon atoms or
4) saturated and/or unsaturated fatty acids having 14 to 20 carbon atoms or
5) hydrogenated and/or unhydrogenated resin acids.

Useful ethylene oxide adducts especially include the alkylatable compounds mentioned in 1) to 5) having 5 to 120, especially 5 to 100, especially 5 to 60 and more preferably 5 to 30 mol of ethylene oxide.

Suitable surface-active agents are likewise the esters of the alkoxylation product of the formula (X) that are known from DE-A 19 712 486 or from DE-A 19 535 246, which correspond to the formula (XI), and the latter optionally in a mixture with the parent compounds of the formula (X). The alkoxylation product of a styrene-phenol condensate of the formula (X) is as defined below:

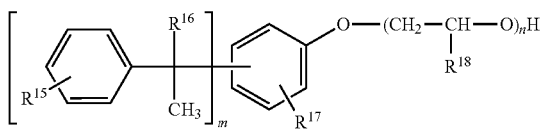

(X)

in which
$R^{15}$ is hydrogen or $C_1$-$C_4$-alkyl,
$R^{16}$ is hydrogen or $CH_3$,
$R^{17}$ is hydrogen, $C_1$-$C_4$-alkyl, $C_1$-$C_4$-alkoxy, $C_1$-$C_4$-alkoxycarbonyl or phenyl,
m is a number from 1 to 4,
n is a number from 6 to 120,
$R^{18}$ is the same or different for every unit indicated by n and is hydrogen, $CH_3$ or phenyl, where, in the case that $CH_3$ is present in some of the different —(—$CH_2$—$CH(R^{18})$—O—) groups, $R^{18}$ is $CH_3$ in 0% to 60% of the total value of n and $R^{18}$ is hydrogen in 100% to 40% of the total value of n, and where, in the case that phenyl is present in some of the different —(—$CH_2$—$CH(R^{18})$—O—) groups, $R^{18}$ is phenyl in 0% to 40% of the total value of n and $R^{18}$ is hydrogen in 100% to 60% of the total value of n.

The esters of the alkoxylation products (X) correspond to the formula (XI)

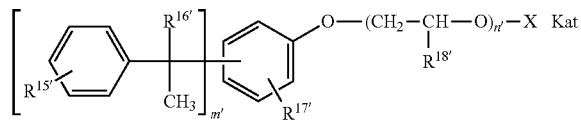

(XI)

in which
$R^{15+}$, $R^{16+}$, $R^{17+}$, $R^{18+}$, m' and n' assume the scope of the definition of $R^{15}$, $R^{16}$, $R^{17}$, $R^{18}$, m and n, but independently thereof,
X is the —$SO_3$, —$SO_2$, —$PO_3$ or —CO—($R^{19}$)—COO group,
Kat is a cation from the group of H, Li, Na, K, $NH_4$ or HO—$CH_2CH_2$—$NH_3$, where two Kat are present in that case that X=—$PO_3$, and
$R^{19}$ is a divalent aliphatic or aromatic radical, preferably $C_1$-$C_4$-alkylene, especially ethylene, $C_2$-$C_4$ monounsaturated radicals, especially acetylene or optionally substituted phenylene, especially ortho-phenylene, where possible substituents preferably include $C_1$-$C_4$-alkyl, $C_1$-$C_4$-alkoxy, $C_1$-$C_4$-alkoxycarbonyl or phenyl.

A preferred surface-active agent used is the compound of the formula (XI). Preferably a compound of the formula (XI) in which X is a radical of the formula —CO—($R^{19}$)—COO$^-$ and $R^{19}$ is as defined above.

Preference is likewise given to using, as surface-active agent, a compound of the formula (XI) together with a compound of the formula (X). Preferably, the surface-active agent in this case contains 5% to 99% by weight of the compound (XI) and 1% to 95% by weight of the compound (X).

The surface-active agent of component (c) is preferably used in the pigment preparation in an amount of 0.1% to 100% by weight, especially 0.5% to 60% by weight, based on the metal azo pigment of the invention used.

It will be appreciated that the pigment preparation of the invention may also contain further additions. For example, additions which lower the viscosity of an aqueous suspension and/or increase the solids content, for example carboxamides and sulphonamides, may be added in an amount of up to 10% by weight, based on the pigment preparation.

Further additions are, for example, inorganic and organic bases, and additions customary for pigment preparations.

Bases include: alkali metal hydroxides, for example NaOH, KOH or organic amines such as alkylamines, especially alkanolamines or alkylalkanolamines.

Particularly preferred examples include methylamine, dimethylamine, trimethylamine, ethanolamine, n-propanolamine, n-butanolamine, diethanolamine, triethanolamine, methylethanolamine or dimethylethanolamine.

Examples of suitable carboxamides and sulphonamides include: urea and substituted ureas such as phenylurea, dodecylurea and others; heterocycles such as barbituric acid, benzimidazolone, benzimidazolone-5-sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1, 3,5-triazine-2,4-diamine, cyanuric acid.

The base is optionally present up to an amount of 20% by weight, preferably to 10% by weight, based on the pigment.

In addition, the pigment preparations of the invention may still contain inorganic and/or organic salts as a result of the preparation.

The pigment preparations of the invention are preferably solid at room temperature. More particularly, the pigment preparations of the invention are in the form of powders or granules.

The pigment preparations of the invention are of excellent suitability for all pigment applications.

The present invention further provides for the use of at least one metal azo pigment of the invention or of a pigment preparation of the invention for pigmentation of all kinds of lacquers for the production of printing inks, distempers or emulsion paints, for the bulk colouring of paper, for the bulk colouring of synthetic, semisynthetic or natural macromolecular substances, for example polyvinyl chloride, polystyrene, polyamide, polyethylene or polypropylene. They can also be used for the spin dyeing of natural, regenerated or synthetic fibres, for example cellulose, polyester, polycarbonate, polyacrylonitrile or polyamide fibres, and for printing of textiles and paper. These pigments can be used to produce finely divided, stable, aqueous pigmentations for emulsion paints and other paints usable for paper colouring, for the pigment printing of textiles, for laminate printing or for the spin dyeing of viscose, by grinding or kneading in the presence of nonionic, anionic or cationic surfactants.

The metal azo pigments of the invention are additionally of excellent suitability for inkjet applications and for colour filters for liquid-crystal displays.

In a likewise preferred embodiment, the pigment preparations of the invention comprise at least one organic compound (d) selected from the group of the terpenes, terpenoids, fatty acids, fatty acid esters and the homo- or copolymers, such as random or block copolymers having a solubility in pH-neutral water at 20° C. of less than 1 g/l, especially less than 0.1 g/l. The organic compound (d) is preferably solid or liquid at room temperature (20° C.) under standard atmosphere and, if it is liquid, has a boiling point of preferably >100° C., especially >150° C.

Preferred polymers have both a hydrophilic and a hydrophobic, preferably polymeric, molecular moiety. Examples of such polymers are random copolymers based on fatty acids or long-chain $C_{12}$-$C_{22}$ hydrocarbons and polyalkylene glycols, especially polyethylene glycol. Further examples include block copolymers based on (poly)hydroxy fatty acids and polyalkylene glycol, especially polyethylene glycol, and also graft copolymers based on poly(meth)acrylate and polyalkylene glycol, especially polyethylene glycol.

Preferred compounds from the group of the terpenes, terpenoids, fatty acids and fatty acid esters include: ocimene, myrcene, geraniol, nerol, linalool, citronellol, geranial, citronellal, neral, limonene, menthol, for example (-)-menthol, menthone or bicyclic monoterpenes, saturated and unsaturated fatty acids having 6 to 22 carbon atoms, for example oleic acid, linoleic acid and linolenic acid or mixtures thereof.

Also useful as organic compounds of component (d) are the abovementioned adduct formers, provided that they obey the criteria desired for the compound of component (d).

Particularly preferred pigment preparations comprise:
50%-99% by weight of at least one metal azo pigment of the invention and
1%-50% by weight, preferably 2% to 50% by weight of at least one compound of component (d).

Optionally, the pigment preparation of the invention additionally comprises a surface-active agent (c).

More preferably, the preparations of the invention consist to an extent of more than 90% by weight, preferably more than 95% by weight and especially more than 97% by weight of at least one metal azo pigment of the invention, at least one organic compound of component (d) and optionally at least one surface-active agent of component (c) and optionally at least one base.

The pigment preparations of the invention in this composition are especially suitable for pigmentation of inkjet inks and colour filters for liquid-crystal displays.

The present invention further provides a process for producing the pigment preparations of the invention, which is characterized in that at least one metal azo pigment of the invention and at least one auxiliary or additive, especially at least one organic compound of component (d) and optionally at least one surface-active agent of component (c) and optionally at least one base are mixed with one another.

The present invention likewise provides for the use of the metal azo pigments of the invention or of the pigment preparations of the invention for production of colour filters for liquid-crystal displays.

This use will be described hereinafter using the example of the pigment dispersion method according to the photoresist process.

The inventive use of the pigment preparations of the invention for production of colour filters is characterized in that, for example, at least one metal azo pigment of the invention or a pigment preparation of the invention, especially a solid pigment preparation, is homogenized, optionally with a binder resin and an organic solvent, optionally with addition of a dispersant, and then wet-comminuted continuously or batchwise to a particle size by number (electron microscopy determination) of 99.5%<1000 nm, preferably 95%<500 nm and especially 90%<200 nm.

Useful wet comminution methods include, for example, stirrer or dissolver dispersion, grinding by means of stirred ball mills or bead mills, kneaders, roll mills, high-pressure homogenization or ultrasound dispersion.

During the dispersion treatment or thereafter, at least one photocurable monomer and a photoinitiator are added. After the dispersion, it is possible to introduce further binder resin, solvent, or admixtures customary for photoresists, as required for the desired photosensitive coating formulation (photoresist) for production of the colour filters. In the context of this invention, a photoresist is understood to mean a preparation comprising at least one photocurable monomer and a photoinitiator.

The present invention also provides a process for producing colour filters for liquid-crystal displays, which is characterized in that at least one metal azo pigment of the invention or a pigment preparation of the invention is homogenized, optionally with a binder resin and an organic solvent, optionally with addition of a dispersant, and then wet-comminuted continuously or batchwise to a particle size by number (electron microscopy determination) of 99.5%<1000 nm and, during the dispersion treatment or thereafter, at least one photocurable monomer and a photoinitiator are added.

Useful possible dispersants include dispersants which are suitable for this application and are generally commercially available, for example polymeric, ionic or nonionic dispersants, for example based on polycarboxylic acids or polysulphonic acids, and also polyethylene oxide-polypropylene oxide block copolymers. In addition, it is also possible to use derivatives of organic dyes as dispersants or co-dispersants.

The production of colour filters therefore gives rise to "formulations" comprising, based on the formulation:
at least one metal azo pigment of the invention,
optionally a binder resin,
at least one organic solvent and
optionally a dispersant.

In a preferred embodiment, the formulation contains (figures based on formulation):
1%-50% by weight of a metal azo pigment of the invention
0%-20% by weight of binder resin
0%-20% by weight of dispersant
10%-94% by weight of organic solvent.

The coating of the photoresist onto a plate to produce the coloured image element patterns can be accomplished either by direct or indirect application. Examples of application methods include: roller coating, spin coating, spray coating, dip coating and air-knife coating.

Useful plates include, according to the application, for example: transparent glasses such as white or blue glass plates, silicate-coated blue glass plate, synthetic resin plate or films based, for example, on polyester resin, polycarbonate resin, acrylic resin or vinyl chloride resin, and also metal plates based on aluminium, copper, nickel or steel, and ceramic plates or semiconductor plates having applied photoelectric transfer elements.

The application is generally effected such that the layer thickness of the photosensitive layer obtained is 0.1 to 10 µm.

The application may be followed by thermal drying of the layer.

The exposure is preferably effected by exposing the photosensitive layer to an active light beam, preferably in the form of an image pattern by means of a photomask. In this way, the layer is cured at the exposed sites. Suitable light sources are, for example: high-pressure and ultrahigh-pressure mercury vapour lamp, xenon lamp, metal halide lamp, fluorescent lamp, and laser beam in the visible region.

The development which follows the exposure removes the unexposed portion of the coating and gives the desired image pattern form of the colour elements. Standard development methods include spraying with or dipping into aqueous alkaline developer solution or into an organic solvent comprising inorganic alkali, for example sodium hydroxide or potassium hydroxide, sodium metasilicate or organic bases such as monoethanolamine, diethanolamine, triethanolamine, triethylamine or salts thereof.

The development is generally followed by a thermal post-drying/curing of the image patterns.

The inventive use of the metal azo pigments is preferably characterized in that they are used alone or in a mixture with other pigments that are customary for the production of colour filters in the colour filters or pigment preparations or formulations for colour filters.

These "other pigments" may either be other metal salts of an azo compound of the formula (I) or pigment preparations based thereon or other inorganic or organic pigments.

With regard to the selection of any other pigments to be used as well, there is no restriction in accordance with the Invention. Both inorganic and organic pigments are useful.

Preferred organic pigments are, for example, those of the monoazo, disazo, laked azo, β-naphthol, naphthol AS, benzimidazolone, disazo condensations, azo metal complex, isoindoline and isoindolinone series, and also polycyclic pigments, for example from the phthalocyanine, quinacridone, perylene, perinone, thioindigo, anthraquinone, dioxazine, quinophthalone and diketopyrrolopyrrole series. Also laked dyes such as Ca, Mg and Al lakes of sulpho- or carboxyl-containing dyes.

Examples of other organic pigments which can optionally be used in addition are:
Colour Index Pigment Yellow 12, 13, 14, 17, 20, 24, 74, 83, 86, 93, 94, 109, 110, 117, 125, 137, 138, 139, 147, 148, 150, 153, 154, 166, 173, 185, or
Colour Index Pigment Orange 13, 31, 36, 38, 40, 42, 43, 51, 55, 59, 61, 64, 65, 71, 72, 73 or
Colour Index Pigment Red 9, 97, 122, 123, 144, 149, 166, 168, 177, 180, 192, 215, 216, 224, 254, 272, or
Colour Index Pigment Green 7, 10, 36, 37, 45, 58 or
Colour Index Pigment Blue 15, 15:1, 15:2, 15:3, 15:4, 15:6, 16 and
Colour Index Pigment Violet 19, 23.

In addition, it is also possible to use soluble organic dyes in conjunction with the novel pigments of the invention.

If "other pigments" are used in addition, the proportion of metal azo pigment of the invention is preferably 1%-99% by weight, especially 20%-80% by weight, based on the total amount of all pigments used. Particular preference is given to the pigment preparations of the Invention and to formulations comprising at least one metal azo pigment of the invention and C.I. Pigment Green 36 and/or C.I. Pigment Green 58 in a ratio of 20% to 80% by weight of metal azo pigment to 80% to 20% by weight of C.I. Pigment Green 36 and/or C.I. Pigment Green 58, preferably of 40% to 60% by weight to 60% to 40% by weight.

There is no particular restriction in accordance with the invention with regard to the binder resins which can be used together with the "pigment" or pigment preparations based thereon in colour filters or in the formulations for production of colour filters, for example by the pigment dispersion method, and useful binder resins are especially the film-forming resins known per se for use in colour filters.

For example, useful binder resins include those from the group of the cellulose resins such as carboxymethyl hydroxyethyl cellulose and hydroxyethyl cellulose, acrylic resins, alkyd resins, melamine resins, epoxy resins, polyvinyl alcohols, polyvinylpyrrolidones, polyamides, polyamide imines, polyimides,
polyimide precursors such as those of the formula (14), disclosed in JP-A 11 217 514, and the esterification products thereof.

Examples of these include reaction products of tetracarboxylic dianhydride with diamines.

Useful binder resins also include those which contain photopolymerizable unsaturated bonds. The binder resins may, for example, be those formed from the group of acrylic resins. Particular mention should be made here of homo- and copolymers of polymerizable monomers, for example methyl(meth)acrylate, ethyl (meth)acrylate, propyl (meth)acrylate, butyl(meth)acrylate, styrene and styrene derivatives, and also copolymers between carboxyl-bearing polymerizable monomers such as (meth)acrylic acid, itaconic acid, maleic acid, maleic anhydride, monoalkyl maleates, especially with alkyl having 1 to 12 carbon atoms, and polymerizable monomers such as (meth)acrylic acid, styrene and styrene derivatives, for example α-methylstyrene, m- or p-methoxystyrene, p-hydroxystyrene. Examples include reaction products of carboxyl-containing polymeric compounds with compounds each containing an oxirane ring and an ethylenically unsaturated bond, for example glycidyl (meth)acrylate, acryloyl glycidyl ether and Itaconic acid monoalkyl glycidyl ether, etc., and also reaction products of carboxyl-containing polymeric compounds with compounds each containing a hydroxyl group and an ethylenically unsaturated bond (unsaturated alcohols), such as allyl alcohol, 2-buten-4-ol, oleyl alcohol, 2-hydroxyethyl (meth)acrylate, N-methylolacrylamide, etc.;
in addition, such binder resins may also contain unsaturated compounds having free isocyanate groups.

In general, the equivalents of unsaturation (molar mass of binder resin per unsaturated compound) of the binder resins mentioned are 200 to 3000, especially 230 to 1000, in order to achieve both sufficient photopolymerizability and hardness of the film. The acid value is generally 20 to 300, especially 40 to 200, in order to achieve sufficient alkali development capacity after the exposure of the film.

The mean molar mass of the binder resins for use is between 1500 and 200 000 and is especially 10 000 to 50 000 g/mol.

The organic solvents used in the inventive use of the pigment preparations for colour filters are, for example, ketones, alkylene glycol ethers, alcohols and aromatic compounds. Examples from the group of the ketones are: acetone, methyl ethyl ketone, cyclohexanone, etc.; from the group of the alkylene glycol ethers: Methyl Cellosolve (ethylene glycol monomethyl ester), Butyl Cellosolve (ethylene glycol monobutyl ether) Methyl Cellosolve Acetate, Ethyl Cellosolve Acetate, Butyl Cellosolve Acetate, ethylene glycol monopropyl ether, ethylene glycol monohexyl ether, ethylene glycol dimethyl ether, diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol t-butyl ether acetate, etc.; from the group of the alcohols: methyl alcohol, ethyl alcohol, Isopropyl alcohol, n-butyl alcohol, 3-methyl-3-methoxybutanol, etc.; from the group of the aromatic solvents: benzene, toluene, xylene, N-methyl-2-pyrrolidone, ethyl N-hydroxymethyl-2-acetate, etc.

Further other solvents are propane-1,2-diol diacetate, 3-methyl-3-methoxybutyl acetate, ethyl acetate, tetrahydrofuran, etc. The solvents may be used individually or in mixtures with one another.

The invention further relates to a photoresist comprising at least one metal azo pigment of the invention or at least one pigment preparation of the invention and at least one photocurable monomer and at least one photoinitiator.

The photocurable monomers contain at least one reactive double bond and optionally other reactive groups in the molecule.

Photocurable monomers are understood in this connection especially to mean reactive solvents or what are called reactive diluents, for example from the group of the mono-, di-, tri- and multifunctional acrylates and methacrylates, vinyl ethers and glycidyl ethers. Useful reactive groups additionally present include allyl, hydroxyl, phosphate, urethane, secondary amine and N-alkoxymethyl groups.

Monomers of this kind are known to those skilled in the art and are detailed, for example, in [*Römpp Lexikon, Lacke und Druckfarben*, Dr. Ulrich Zorll, Thieme Verlag Stuttgart—New York, 1998, p. 491/492].

The selection of monomers is guided especially by the nature and intensity of the radiation type used for the exposure, the desired reaction with the photoinitiator and the film properties. It is also possible to use combinations of monomers.

Reaction photoinitiators or photoinitiators are understood to mean compounds which form reactive intermediates as a result of the absorption of visible or ultraviolet radiation, which can trigger a polymerization reaction, for example of the abovementioned monomers and/or binder resins. Reaction photoinitiators are likewise commonly known and can likewise be found in [*Römpp Lexikon, Lacke und Druckfarben*, Dr. Ulrich Zorll, Thieme Verlag Stuttgart-New York, 1998, p. 445/446].

According to the invention, there is no restriction with regard to the photocurable monomers or photoinitiators to be used.

The invention preferably relates to photoresists comprising
A) at least one metal azo pigment of the invention, especially in a mixture with other pigments, preferably C.I. Pigment Green 36 and/or Pigment Green 58 or a pigment preparation of the invention based thereon,
B1) at least one photocurable monomer,
B2) at least one photoinitiator,
C1) optionally an organic solvent,
D) optionally a dispersant,
E) optionally a binder resin,
and optionally further additions.

According to the invention, there is also no restriction with regard to the methodology for production of the coloured image element patterns based on the pigments or solid pigment preparations for use in accordance with the invention. As well as the above-described photolithographic method, other methods such as offset printing, chemical etching or inkjet printing are likewise suitable. The selection of the suitable binder resins and solvents and of pigment carrier media and further additions should be matched to the particular method. In the inkjet method, which is understood to mean both thermal and mechanical and piezo-mechanical inkjet printing, useful carrier media for the pigments and any binder resins are not only purely organic but also aqueous-organic carrier media; aqueous-organic carrier media are actually preferred.

The examples which follow are intended to illustrate the present invention but without restricting it thereto.

EXAMPLES

Preparation of the Azobarbituric Acid Precursor (Method 1)

46.2 g of diazobarbituric acid and 38.4 g of barbituric acid are introduced into 1100 g of distilled water at 85° C. Subsequently, aqueous potassium hydroxide solution was used to establish a pH of about 5 and the mixture was stirred for 90 minutes.

Example 1

Preparation of Pigment A 1500 g of distilled water were added at 82° C. to an azobarbituric acid prepared according to Method 1. Thereafter, 75.7 g of melamine were introduced. Subsequently, 0.3 mol of an about 30% copper(II) chloride solution was added dropwise. After 3 hours at 82° C., KOH was used to establish a pH of about 5.5. Thereafter, dilution was effected at 90° C. with about 300 g of distilled water. Subsequently, 34 g of 30% hydrochloric acid were added dropwise and the mixture was heat-treated at 90° C. for 12 hours. Thereafter, aqueous potassium hydroxide solution was used to establish a pH of about 5. Subsequently, the pigment was isolated on a suction filter, washed and dried in a vacuum drying cabinet at 80° C., and ground in a standard laboratory mil for about 2 minutes. (=pigment A)

Example 2

Preparation of Pigment B 1500 g of distilled water were added at 82° C. to an azobarbituric acid prepared according to Method 1. Subsequently, 10 g of 30% hydrochloric acid were added dropwise. Thereafter, 79.4 g of melamine were introduced. Subsequently, 0.3 mol of an about 25% zinc chloride solution was added dropwise. After 3 hours at 82° C., KOH was used to establish a pH of about 5.5. Thereafter, dilution was effected at 90° C. with about 100 g of distilled water. Subsequently, 21 g of 30% hydrochloric acid were added dropwise and the mixture was heat-treated at 90° C. for 12 hours. Thereafter, aqueous potassium hydroxide solution was used for adjustment to a pH of about 5. Subsequently, the pigment was isolated on a suction filter, washed and dried in a vacuum drying cabinet at 80° C., and ground in a standard laboratory mill for about 2 minutes. (=pigment B)

Examples 3 to 15

Preparation of Pigments C to O

Inventive Examples 3 to 15 which follow were prepared analogously to Example 2. Zinc chloride solution was replaced in each case by a mixed solution of zinc chloride and copper(II) chloride as specified.

Example 3: 0.3 mol of Zn replaced by 0.282 mol of Zn+0.0015 mol of Cu (=pigment C)
Example 4: 0.3 mol of Zn replaced by 0.282 mol of Zn+0.006 mol of Cu (=pigment D)
Example 5: 0.3 mol of Zn replaced by 0.282 mol of Zn+0.018 mol of Cu (=pigment E)
Example 6: 0.3 mol of Zn replaced by 0.270 mol of Zn+0.030 mol of Cu (=pigment F)
Example 7: 0.3 mol of Zn replaced by 0.240 mol of Zn+0.060 mol of Cu (=pigment G)
Example 8: 0.3 mol of Zn replaced by 0.210 mol of Zn+0.090 mol of Cu (=pigment H)
Example 9: 0.3 mol of Zn replaced by 0.180 mol of Zn+0.120 mol of Cu (=pigment I)
Example 10: 0.3 mol of Zn replaced by 0.150 mol of Zn+0.150 mol of Cu (=pigment J)
Example 11: 0.3 mol of Zn replaced by 0.120 mol of Zn+0.120 mol of Cu (=pigment K)
Example 12: 0.3 mol of Zn replaced by 0.090 mol of Zn+0.210 mol of Cu (=pigment L)
Example 13: 0.3 mol of Zn replaced by 0.060 mol of Zn+0.240 mol of Cu (=pigment M)
Example 14: 0.3 mol of Zn replaced by 0.030 mol of Zn+0.270 mol of Cu (=pigment N)
Example 15: 0.3 mol of Zn replaced by 0.018 mol of Zn+0.282 mol of Cu (=pigment O)
Example 16: 0.3 mol of Zn replaced by 0.270 mol of Zn+0.015 mol of Cu+0.015 mol of Ni (=pigment AA)
Example 17: 0.3 mol of Zn replaced by 0.270 mol of Zn+0.015 mol of Cu+0.015 mol of Cd (=pigment AB)
Example 18: 0.3 mol of Zn replaced by 0.270 mol of Zn+0.015 mol of Cu+0.0075 mol of Fe+0.0075 mol of Pb (=pigment AC)
Example 19: 0.3 mol of Zn replaced by 0.270 mol of Zn+0.015 mol of Cu+0.006 mol of Ni+0.004 mol of Cr+0.003 mol of Fe (=pigment AD)
Example 20: 0.3 mol of Zn replaced by 0.150 mol of Zn+0.135 mol of Cu+0.015 mol of Cd (=pigment AE)
Example 21: 0.3 mol of Zn replaced by 0.150 mol of Zn+0.135 mol of Cu+0.010 mol of Cr (=pigment AF)
Example 22: 0.3 ml of Zn replaced by 0.150 mol of Zn+0.135 mol of Cu+0.0075 mol of Co+0.0075 mol of Pb (=pigment AG)
Example 23: 0.3 mol of Zn replaced by 0.150 mol of Zn+0.135 mol of Cu+0.006 mol of Ni+0.006 mol of Pb+0.003 mol of Cd (=pigment AH)
Example 24: 0.3 mol of Zn replaced by 0.015 mol of Zn+0.270 mol of Cu+0.015 mol of Fe (=pigment AI)
Example 25: 0.3 mol of Zn replaced by 0.015 mol of Zn+0.270 mol of Cu+0.015 mol of Cd (=pigment AJ)
Example 26: 0.3 mol of Zn replaced by 0.015 mol of Zn+0.270 mol of Cu+0.0075 mol of Ni+0.0075 mol of Co (=pigment AK)
Example 27: 0.3 mol of Zn replaced by 0.015 mol of Zn+0.270 mol of Cu+0.004 mol of Cr+0.006 mol of Pb+0.003 mol of Ni (=pigment AL)
Example 28: 0.3 mol of Zn replaced by 0.273 mol of Zn+0.015 mol of Cu+0.012 mol of Ni (=pigment AM)
Example 29: 0.3 mol of Zn replaced by 0.273 mol of Zn+0.015 mol of Cu+0.012 mol of Co (=pigment AN)
Example 30: 0.3 mol of Zn replaced by 0.273 mol of Zn+0.015 mol of Cu+0.004 mol of Cr+0.006 mol of Cd (=pigment AO)
Example 30: 0.3 mol of Zn replaced by 0.273 mol of Zn+0.015 mol of Cu+0.0045 mol of Cd+0.0045 mol of Pb+0.003 mol of Fe (=pigment AP)

The pigments produced according to Synthesis Examples 1 to 30 were used to make up the following samples according to Table 1:

TABLE 1

|  |  |  | Molar ratio of Cu/Zn/Me |
|---|---|---|---|
| Sample 1: | 10 g Pigment A |  | 100/0/0 |
| Sample 2: | 10 g Pigment B |  | 0/100/0 |
| Sample 3: | 10 g Pigment C |  | 0.5/99.5/0 |
| Sample 4: | 10 g Pigment D |  | 2/98/0 |
| Sample 5: | 10 g Pigment E |  | 6/94/0 |
| Sample 6: | 10 g Pigment F |  | 10/90/0 |
| Sample 7: | 10 g Pigment G |  | 20/80/0 |
| Sample 8: | 10 g Pigment H |  | 30/70/0 |
| Sample 9: | 10 g Pigment I |  | 40/60/0 |
| Sample 10: | 10 g Pigment J |  | 50/50/0 |
| Sample 11: | 10 g Pigment K |  | 60/40/0 |
| Sample 12: | 10 g Pigment L |  | 70/30/0 |
| Sample 13: | 10 g Pigment M |  | 80/20/0 |
| Sample 14: | 10 g Pigment N |  | 90/10/0 |
| Sample 15: | 10 g Pigment O |  | 94/6/0 |
| Sample 16: | 0.05 g Pigment A | 9.95 g Pigment B | 0.5/99.5/0 |
| Sample 17: | 0.2 g Pigment A | 9.80 g Pigment B | 2/98/0 |
| Sample 18: | 0.6 g Pigment A | 9.40 g Pigment B | 6/94/0 |
| Sample 19: | 1.00 g Pigment A | 9.00 g Pigment B | 10/90/0 |
| Sample 20: | 2.00 g Pigment A | 8.00 g Pigment B | 20/80/0 |

TABLE 1-continued

| | | | Molar ratio of Cu/Zn/Me |
|---|---|---|---|
| Sample 21: | 3.00 g Pigment A | 7.00 g Pigment B | 30/70/0 |
| Sample 22: | 4.00 g Pigment A | 6.00 g Pigment B | 40/60/0 |
| Sample 23: | 5.00 g Pigment A | 5.00 g Pigment B | 50/50/0 |
| Sample 24: | 6.00 g Pigment A | 4.00 g Pigment B | 60/40/0 |
| Sample 25: | 7.00 g Pigment A | 3.00 g Pigment B | 70/30/0 |
| Sample 26: | 8.00 g Pigment A | 2.00 g Pigment B | 80/20/0 |
| Sample 27: | 9.00 g Pigment A | 1.00 g Pigment B | 90/10/0 |
| Sample 28: | 9.40 g Pigment A | 0.06 g Pigment B | 94/6/0 |
| Sample 29: | 10 g Pigment AA | | 5/90/5 Ni |
| Sample 30: | 10 g Pigment AB | | 5/90/5 Cd |
| Sample 31: | 10 g Pigment AC | | 5/90/2.5 Fe/2.5 Pb |
| Sample 32: | 10 g Pigment AD | | 5/90/2 Ni/2 Cr/1 Fe |
| Sample 33: | 10 g Pigment AE | | 45/50/5 Cd |
| Sample 34: | 10 g Pigment AF | | 45/50/5 Cr |
| Sample 35: | 10 g Pigment AG | | 45/50/2.5 Co/2.5 Pb |
| Sample 36: | 10 g Pigment AH | | 45/50/2 Ni/2 Fe/1 Cd |
| Sample 37: | 10 g Pigment AI | | 90/5/5 Fe |
| Sample 38: | 10 g Pigment AJ | | 90/5/5 Cd |
| Sample 39: | 10 g Pigment AK | | 90/5/2.5 Ni/2.5 Co |
| Sample 40: | 10 g Pigment AL | | 90/5/2 Cr/2 Pb/1 Ni |
| Sample 41: | 10 g Pigment AM | | 5/91/4 Ni |
| Sample 42: | 10 g Pigment AN | | 5/91/4 Co |
| Sample 43 | 10 g Pigment AO | | 5/91/2 Cr/2 Cd |
| Sample 44: | 10 g Pigment AP | | 5/91/1.5 Cd/1.5 Pb/1 Fe |

Samples 1 to 44 were each subjected to a determination of dispersion hardness and a determination of colour strength by the methods described hereinafter. The results are listed in Table 2.

Determination of Dispersion Hardness

Dispersion hardness is measured according to DIN 53 775, Part 7, with a cold-rolling temperature of 25° C. and a hot-rolling temperature of 150° C. All the dispersion hardnesses reported in this application were determined by this modified DIN method.

Determination of Colour Strength in PVC

The test medium produced was a flexible PVC compound, by homogenizing 67.5% Vestolit® E7004 (Vestolit GmbH), 29.0% Hexamoll® Dinch (BASF), 2.25% Baerostab UBZ 770 (Baerlocher GmbH) and 1.25% isocolor white pigment paste (ISL-Chemie) with a laboratory dissolver.

A laboratory roll mil was used to add 100 g of the PVC compound at 150° C. to two rollers of diameter 150 mm that rotate at 20 min$^{-1}$ and 18 min$^{-1}$. Together with 0.10 g of pigment, the milled sheet that formed was guided through a roller gap of 0.10 mm eight times. Then the homogeneously coloured milled sheet was removed with a roller gap of 0.8 mm and laid out flat over a metal surface. The cooled milled sheet was then passed through a roller gap of 0.2 mm between two heated rollers of diameter 110 mm that rotate at 26 min$^{-1}$ and 24 min$^{-1}$ eight times. To smooth the surface, this milled sheet was applied to the rollers at 150° C. once again, removed at 0.8 mm and left to cool on a smooth surface. Specimens of this sheet served to determine the relative colour strength.

The relative colour strength was calculated after measuring the reflectance of the specimens against a white background by means of a spectrophotometer with d/8 measurement geometry under D65 illuminant with a 10° observer according to DIN 55986 using the sum total of the K/S values over the visible spectrum (400 nm-700 mm).

TABLE 2

| | Status | Dispersion hardness | Colour strength % |
|---|---|---|---|
| Sample 1: | noninventive | 350 | 80 |
| Sample 2: | noninventive | 450 | 30 |
| Sample 3: | inventive | 140 | 100 |
| Sample 4: | inventive | 135 | 102 |
| Sample 5: | inventive | 110 | 103 |
| Sample 6: | inventive | 105 | 105 |
| Sample 7: | inventive | 100 | 107 |
| Sample 8: | inventive | 110 | 110 |
| Sample 9: | inventive | 95 | 112 |
| Sample 10: | inventive | 90 | 113 |
| Sample 11: | inventive | 95 | 110 |
| Sample 12: | inventive | 90 | 115 |
| Sample 13: | inventive | 85 | 114 |
| Sample 14: | inventive | 80 | 119 |
| Sample 15: | inventive | 80 | 120 |
| Sample 16: | inventive | 160 | 98 |
| Sample 17: | inventive | 140 | 100 |
| Sample 18: | inventive | 115 | 103 |
| Sample 19: | inventive | 110 | 103 |
| Sample 20: | inventive | 105 | 105 |
| Sample 21: | inventive | 115 | 106 |
| Sample 22: | inventive | 100 | 105 |
| Sample 23: | inventive | 95 | 109 |
| Sample 24: | inventive | 100 | 109 |
| Sample 25: | inventive | 95 | 111 |
| Sample 26: | inventive | 90 | 112 |
| Sample 27: | inventive | 90 | 114 |
| Sample 28: | inventive | 85 | 115 |
| Sample 29: | inventive | 115 | 107 |
| Sample 30: | inventive | 120 | 109 |
| Sample 31: | inventive | 110 | 108 |
| Sample 32: | inventive | 112 | 110 |
| Sample 33: | inventive | 90 | 112 |
| Sample 34: | inventive | 95 | 115 |
| Sample 35: | inventive | 95 | 114 |
| Sample 36: | inventive | 90 | 115 |
| Sample 37: | inventive | 75 | 118 |
| Sample 38: | inventive | 80 | 119 |
| Sample 39: | inventive | 85 | 116 |
| Sample 40: | inventive | 75 | 120 |
| Sample 41: | inventive | 115 | 107 |

TABLE 2-continued

| | Status | Dispersion hardness | Colour strength % |
|---|---|---|---|
| Sample 42: | inventive | 110 | 108 |
| Sample 43: | inventive | 120 | 106 |
| Sample 44: | inventive | 115 | 109 |

Conclusion: It is apparent from Table 2 that the noninventive samples all have a dispersion hardness above 100 and hence are much higher than the inventive samples. It follows from this that the noninventive samples are more difficult to disperse and more difficult to process than the inventive samples.

In addition, all the samples of the invention have elevated colour strengths. This means that these samples, based on equal starting weights, attain higher optical densities than the noninventive samples.

X-ray Diffractometry Analysis

The x-ray diffractometry measurements were conducted in a PANalytical EMPYREAN theta/theta reflection diffractometer with a PIXcel detector, which is suitable for identification of crystalline phases.

Instrument Settings:
Diffractometer system EMPYREAN
Measurement program Scan 5-40 Standard_Reflexion VB, irradiated length 17 mm, mask 15 mm
Start position [° 2th.] 5
End position [° 2th.] 40
Step width [° 2th.] 0.0130
Step time [s]48.2
Scan mode continuous
OED operating mode scanning
OED length [° 2th.] 3.35
Type of divergence slit automatic
Irradiated length [mm] 17.00
Sample length [mm] 10.00
Anode material Cu
K-alpha1 [Å] 1.54060
K-alpha2 [Å] 1.54443
K-beta [Å] 1.39225
K-A2/K-A1 ratio 0.50000
Filter nickel
Generator setting 40 mA, 40 kV
Goniometer radius [mm] 240.00
Focus-div. slit gap [mm] 100.00
Primary beam monochromator none
Sample rotation yes
Procedure:

The samples of Examples 1 to 28 as described in Table 1 were analysed as follows:

For each of the theta/theta measurements, an amount of the sample to be tested was introduced into the recess of the sample holder. The surface of the sample was smoothed by means of a scraper.

Then the sample holder was introduced into the sample changer of the diffractometer and the measurement was conducted. The theta values of the samples analysed were determined by the method described above. In this way, analyses of samples 1 to 28 were undertaken. The reflection values determined after the baseline correction were reported in Tables 3 to 30.

In Tables 3 to 30, in the first column, the reflections measured were each numbered serially. In column 2, the positions of the reflections measured were stated as 2theta values; in column 3, the 2theta values determined were converted by means of the Bragg equation to d values for the interplanar spacings. In the fourth and fifth columns are the values of the intensities measured (peak height of the reflection above the baseline), firstly as absolute values in the unit of "counts" [cts] and in terms of their relative intensity in percent.

TABLE 3

Sample 1: 10 g pigment A (100 mol % copper) noninventive

| Peak Number | Pos. [°2Th.] | Height [cts] | d-spacing [Å] | Rel. Int. [%] |
|---|---|---|---|---|
| 1 | 7.2094 | 3642.74 | 12.26193 | 43.46 |
| 2 | 8.3268 | 792.63 | 10.61882 | 9.46 |
| 3 | 10.6297 | 757.72 | 8.32286 | 9.04 |
| 4 | 11.8561 | 722.75 | 7.46459 | 8.62 |
| 5 | 13.7967 | 1062.35 | 6.41869 | 12.67 |
| 6 | 16.6521 | 679.59 | 5.32392 | 8.11 |
| 7 | 17.2085 | 1839.19 | 5.15302 | 21.94 |
| 8 | 17.7183 | 2228.24 | 5.00588 | 26.58 |
| 9 | 18.2155 | 2078.06 | 4.87036 | 24.79 |
| 10 | 19.7576 | 421.01 | 4.49356 | 5.02 |
| 11 | 20.4804 | 541.97 | 4.33658 | 6.47 |
| 12 | 22.0776 | 351.15 | 4.02633 | 4.19 |
| 13 | 24.1154 | 1923.01 | 3.69053 | 22.94 |
| 14 | 25.9870 | 5003.44 | 3.42881 | 59.69 |
| 15 | 27.0359 | 4009.69 | 3.29812 | 47.84 |
| 16 | 27.9041 | 8382.32 | 3.19745 | 100.00 |
| 17 | 28.4884 | 5869.51 | 3.13318 | 70.02 |
| 18 | 30.3188 | 738.91 | 2.94808 | 8.82 |
| 19 | 31.3875 | 930.10 | 2.85009 | 11.10 |
| 20 | 34.6582 | 1242.15 | 2.58825 | 14.82 |
| 21 | 36.2222 | 427.46 | 2.48001 | 5.10 |
| 22 | 38.4520 | 582.54 | 2.34118 | 6.95 |

TABLE 4

Sample 2: 10 g pigment B (100 mol % zinc) noninventive

| Peak Number | Pos. [°2Th.] | Height [cts] | d-spacing [Å] | Rel. Int. [%] |
|---|---|---|---|---|
| 1 | 6.3948 | 2945.75 | 13.82199 | 25.63 |
| 2 | 6.8383 | 1840.02 | 12.92653 | 16.01 |
| 3 | 9.9386 | 1432.02 | 8.90002 | 12.46 |
| 4 | 10.4376 | 2712.14 | 8.47563 | 23.60 |
| 5 | 11.1586 | 735.76 | 7.92954 | 6.40 |
| 6 | 13.0241 | 449.58 | 6.79767 | 3.91 |
| 7 | 14.7483 | 528.28 | 6.00661 | 4.60 |
| 8 | 16.4912 | 1407.22 | 5.37551 | 12.24 |
| 9 | 17.3233 | 746.17 | 5.11914 | 6.49 |
| 10 | 18.1902 | 196.22 | 4.87708 | 1.71 |
| 11 | 18.6971 | 189.98 | 4.74598 | 1.65 |
| 12 | 20.0597 | 711.80 | 4.42658 | 6.19 |
| 13 | 20.8417 | 1635.72 | 4.26222 | 14.23 |
| 14 | 21.1580 | 1939.66 | 4.19920 | 16.87 |
| 15 | 24.3012 | 102.47 | 3.66272 | 0.89 |
| 16 | 25.3774 | 1833.55 | 3.50978 | 15.95 |
| 17 | 26.6634 | 10032.41 | 3.34335 | 87.28 |
| 18 | 27.0385 | 11494.33 | 3.29781 | 100.00 |
| 19 | 27.8974 | 3209.62 | 3.19821 | 27.93 |
| 20 | 28.4615 | 2477.15 | 3.13609 | 21.55 |
| 21 | 28.9166 | 1876.82 | 3.08776 | 16.33 |
| 22 | 31.3971 | 789.23 | 2.84924 | 6.87 |
| 23 | 32.0566 | 1166.28 | 2.79212 | 10.15 |
| 24 | 34.0531 | 162.92 | 2.63285 | 1.42 |
| 25 | 35.1166 | 463.91 | 2.55551 | 4.04 |
| 26 | 36.0936 | 422.32 | 2.48855 | 3.67 |
| 27 | 37.0065 | 493.27 | 2.42923 | 4.29 |

TABLE 5

Sample 3: 10 g pigment C (0.5 mol % copper/99.5 mol % zinc) inventive

| Peak Number | Pos. [°2Th.] | Height [cts] | d-spacing [Å] | Rel. Int. [%] |
|---|---|---|---|---|
| 1 | 6.4662 | 1350.32 | 13.65813 | 31.79 |
| 2 | 6.4823 | 675.16 | 13.65813 | 15.90 |
| 3 | 6.8350 | 2063.52 | 12.92195 | 48.58 |
| 4 | 6.8521 | 1031.76 | 12.92195 | 24.29 |
| 5 | 8.5403 | 153.75 | 10.34525 | 3.62 |
| 6 | 8.5616 | 76.88 | 10.34525 | 1.81 |
| 7 | 9.5163 | 113.98 | 9.28635 | 2.68 |
| 8 | 9.5400 | 56.99 | 9.28635 | 1.34 |
| 9 | 10.3920 | 1669.72 | 8.50568 | 39.31 |
| 10 | 10.4179 | 834.86 | 8.50568 | 19.66 |
| 11 | 11.1560 | 261.56 | 7.92481 | 6.16 |
| 12 | 11.1838 | 130.78 | 7.92481 | 3.08 |
| 13 | 12.9936 | 486.54 | 6.80789 | 11.46 |
| 14 | 13.0261 | 243.27 | 6.80789 | 5.73 |
| 15 | 14.1901 | 220.21 | 6.23645 | 5.18 |
| 16 | 14.2255 | 110.11 | 6.23645 | 2.59 |
| 17 | 14.7178 | 536.78 | 6.01402 | 12.64 |
| 18 | 14.7545 | 268.39 | 6.01402 | 6.32 |
| 19 | 15.6351 | 520.98 | 5.66317 | 12.27 |
| 20 | 15.6742 | 260.49 | 5.66317 | 6.13 |
| 21 | 16.5766 | 710.08 | 5.34359 | 16.72 |
| 22 | 16.6180 | 355.04 | 5.34359 | 8.36 |
| 23 | 16.6389 | 0.00 | 5.32372 | 0.00 |
| 24 | 16.6805 | 0.00 | 5.32372 | 0.00 |
| 25 | 17.2557 | 1245.16 | 5.13479 | 29.32 |
| 26 | 17.2989 | 622.58 | 5.13479 | 14.66 |
| 27 | 18.6134 | 477.17 | 4.76320 | 11.23 |
| 28 | 18.6600 | 238.58 | 4.76320 | 5.62 |
| 29 | 20.2603 | 686.20 | 4.37958 | 16.16 |
| 30 | 20.3111 | 343.10 | 4.37958 | 8.08 |
| 31 | 20.7787 | 2208.41 | 4.27147 | 51.99 |
| 32 | 20.8309 | 1104.10 | 4.27147 | 25.99 |
| 33 | 23.9341 | 318.53 | 3.71499 | 7.50 |
| 34 | 23.9944 | 159.26 | 3.71499 | 3.75 |
| 35 | 24.4209 | 325.56 | 3.64202 | 7.66 |
| 36 | 24.4825 | 162.78 | 3.64202 | 3.83 |
| 37 | 25.4307 | 417.95 | 3.49966 | 9.84 |
| 38 | 25.4949 | 208.97 | 3.49966 | 4.92 |
| 39 | 25.8758 | 1083.40 | 3.44045 | 25.51 |
| 40 | 25.9412 | 541.70 | 3.44045 | 12.75 |
| 41 | 26.5698 | 4247.40 | 3.35214 | 100.00 |
| 42 | 26.6370 | 2123.70 | 3.35214 | 50.00 |
| 43 | 27.0363 | 3857.50 | 3.29534 | 90.82 |
| 44 | 27.1048 | 1928.75 | 3.29534 | 45.41 |
| 45 | 27.8647 | 1630.72 | 3.19923 | 38.39 |
| 46 | 27.9354 | 815.36 | 3.19923 | 19.20 |
| 47 | 28.3962 | 1211.30 | 3.14055 | 28.52 |
| 48 | 28.4683 | 605.65 | 3.14055 | 14.26 |
| 49 | 28.8588 | 74.89 | 3.09126 | 1.76 |
| 50 | 28.9320 | 37.45 | 3.09126 | 0.88 |
| 51 | 29.1134 | 722.19 | 3.06479 | 17.00 |
| 52 | 29.1873 | 361.09 | 3.06479 | 8.50 |
| 53 | 31.3759 | 618.69 | 2.84876 | 14.57 |
| 54 | 31.4558 | 309.34 | 2.84876 | 7.28 |
| 55 | 31.7678 | 645.30 | 2.81451 | 15.19 |
| 56 | 31.8488 | 322.65 | 2.81451 | 7.60 |
| 57 | 34.8929 | 679.56 | 2.56926 | 16.00 |
| 58 | 34.9824 | 339.78 | 2.56926 | 8.00 |
| 59 | 35.0000 | 1023.02 | 2.56164 | 24.09 |
| 60 | 35.0897 | 511.51 | 2.56164 | 12.04 |
| 61 | 37.7869 | 504.11 | 2.37887 | 11.87 |
| 62 | 37.8844 | 252.06 | 2.37887 | 5.93 |

TABLE 6

Sample 4: 10 g pigment D (2 mol % copper/98 mol % zinc) inventive

| Peak Number | Pos. [°2Th.] | Height [cts] | d-spacing [Å] | Rel. Int. [%] |
|---|---|---|---|---|
| 1 | 6.4865 | 1495.79 | 13.61539 | 35.60 |
| 2 | 6.5027 | 747.89 | 13.61539 | 17.80 |
| 3 | 6.8367 | 1749.31 | 12.91876 | 41.64 |
| 4 | 6.8537 | 874.66 | 12.91876 | 20.82 |
| 5 | 9.7368 | 131.47 | 9.07648 | 3.13 |
| 6 | 9.7611 | 65.73 | 9.07648 | 1.56 |
| 7 | 10.3801 | 2138.01 | 8.51542 | 50.89 |
| 8 | 10.4059 | 1069.00 | 8.51542 | 25.44 |
| 9 | 11.1018 | 206.48 | 7.96339 | 4.91 |
| 10 | 11.1295 | 103.24 | 7.96339 | 2.46 |
| 11 | 13.0214 | 463.12 | 6.79342 | 11.02 |
| 12 | 13.0539 | 231.56 | 6.79342 | 5.51 |
| 13 | 14.8461 | 404.89 | 5.96232 | 9.64 |
| 14 | 14.8832 | 202.45 | 5.96232 | 4.82 |
| 15 | 15.6258 | 490.08 | 5.66652 | 11.67 |
| 16 | 15.6649 | 245.04 | 5.66653 | 5.83 |
| 17 | 16.5332 | 542.85 | 5.35749 | 12.92 |
| 18 | 16.5746 | 271.43 | 5.35749 | 6.46 |
| 19 | 17.3550 | 1050.37 | 5.10563 | 25.00 |
| 20 | 17.3984 | 525.19 | 5.10564 | 12.50 |
| 21 | 18.7393 | 375.76 | 4.73148 | 8.94 |
| 22 | 18.7863 | 187.88 | 4.73148 | 4.47 |
| 23 | 20.1724 | 603.85 | 4.39845 | 14.37 |
| 24 | 20.2231 | 301.93 | 4.39845 | 7.19 |
| 25 | 20.8650 | 2390.83 | 4.25399 | 56.91 |
| 26 | 20.9174 | 1195.41 | 4.25399 | 28.45 |
| 27 | 23.8615 | 183.54 | 3.72612 | 4.37 |
| 28 | 23.9217 | 91.77 | 3.72612 | 2.18 |
| 29 | 24.4978 | 191.49 | 3.63076 | 4.56 |
| 30 | 24.5596 | 95.75 | 3.63076 | 2.28 |
| 31 | 25.8984 | 804.22 | 3.43749 | 19.14 |
| 32 | 25.9639 | 402.11 | 3.43749 | 9.57 |
| 33 | 26.5935 | 4201.25 | 3.34921 | 100.00 |
| 34 | 26.6608 | 2100.63 | 3.34921 | 50.00 |
| 35 | 27.0564 | 3938.87 | 3.29294 | 93.75 |
| 36 | 27.1250 | 1969.43 | 3.29294 | 46.88 |
| 37 | 27.9205 | 1166.82 | 3.19297 | 27.77 |
| 38 | 27.9913 | 583.41 | 3.19297 | 13.89 |
| 39 | 28.4203 | 1077.49 | 3.13794 | 25.65 |
| 40 | 28.4924 | 538.74 | 3.13794 | 12.82 |
| 41 | 29.1652 | 739.15 | 3.05946 | 17.59 |
| 42 | 29.2393 | 369.58 | 3.05946 | 8.80 |
| 43 | 31.4118 | 853.63 | 2.84559 | 20.32 |
| 44 | 31.4919 | 426.82 | 2.84559 | 10.16 |
| 45 | 31.7296 | 675.78 | 2.81781 | 16.09 |
| 46 | 31.8105 | 337.89 | 2.81781 | 8.04 |
| 47 | 35.1799 | 829.77 | 2.54895 | 19.75 |
| 48 | 35.2702 | 414.88 | 2.54895 | 9.88 |
| 49 | 35.9647 | 140.19 | 2.49511 | 3.34 |
| 50 | 36.0571 | 70.09 | 2.49511 | 1.67 |
| 51 | 37.0041 | 100.87 | 2.42738 | 2.40 |
| 52 | 37.0993 | 50.44 | 2.42738 | 1.20 |
| 53 | 37.7306 | 432.35 | 2.38229 | 10.29 |
| 54 | 37.8279 | 216.17 | 2.38229 | 5.15 |

TABLE 7

Sample 5: 10 g pigment E (6 mol % copper/94 mol % zinc) inventive

| Peak Number | Pos. [°2Th.] | Height [cts] | d-spacing [Å] | Rel. Int. [%] |
|---|---|---|---|---|
| 1 | 6.4993 | 1834.79 | 13.59991 | 17.37 |
| 2 | 6.8254 | 1592.10 | 12.95096 | 15.07 |
| 3 | 10.4043 | 2436.67 | 8.50265 | 23.06 |
| 4 | 13.1235 | 365.13 | 6.74640 | 3.46 |
| 5 | 14.7362 | 253.54 | 6.01152 | 2.40 |
| 6 | 15.5446 | 226.46 | 5.70064 | 2.14 |
| 7 | 16.5915 | 749.08 | 5.34324 | 7.09 |
| 8 | 17.3267 | 585.29 | 5.11813 | 5.54 |

TABLE 7-continued

Sample 5: 10 g pigment E (6 mol % copper/94 mol % zinc) inventive

| Peak Number | Pos. [°2Th.] | Height [cts] | d-spacing [Å] | Rel. Int. [%] |
|---|---|---|---|---|
| 9 | 18.1634 | 326.29 | 4.88421 | 3.09 |
| 10 | 19.7732 | 456.42 | 4.49005 | 4.32 |
| 11 | 20.9688 | 2019.92 | 4.23666 | 19.12 |
| 12 | 22.0563 | 226.76 | 4.03018 | 2.15 |
| 13 | 23.8948 | 188.55 | 3.72409 | 1.78 |
| 14 | 25.4209 | 1540.54 | 3.50387 | 14.58 |
| 15 | 26.6719 | 9407.25 | 3.34231 | 89.04 |
| 16 | 27.1015 | 10564.86 | 3.29030 | 100.00 |
| 17 | 27.9074 | 4536.37 | 3.19708 | 42.94 |
| 18 | 28.4833 | 3030.81 | 3.13373 | 28.69 |
| 19 | 29.1504 | 1491.87 | 3.06352 | 14.12 |
| 20 | 31.6564 | 933.77 | 2.82649 | 8.84 |
| 21 | 35.0880 | 208.81 | 2.55753 | 1.98 |
| 22 | 37.2241 | 184.47 | 2.41553 | 1.75 |

TABLE 8

Sample 6: 10 g pigment F (10 mol % copper/90 mol % zinc) inventive

| Pos. [°2Th.] | Height [cts] | d-spacing [Å] | Rel. Int. [%] |
|---|---|---|---|
| 6.4530 | 2622.68 | 13.69736 | 26.66 |
| 6.9252 | 923.02 | 12.75391 | 9.38 |
| 9.4842 | 470.19 | 9.31772 | 4.78 |
| 9.9075 | 1481.10 | 8.92785 | 15.06 |
| 10.4742 | 3311.65 | 8.44607 | 33.66 |
| 10.9939 | 806.81 | 8.04129 | 8.20 |
| 13.0372 | 548.01 | 6.79086 | 5.57 |
| 14.6644 | 325.48 | 6.04077 | 3.31 |
| 15.6750 | 478.95 | 5.65353 | 4.87 |
| 16.4722 | 1333.03 | 5.38166 | 13.55 |
| 17.1866 | 455.57 | 5.15528 | 4.63 |
| 18.5264 | 172.38 | 4.78931 | 1.75 |
| 19.9554 | 756.14 | 4.44946 | 7.69 |
| 20.2573 | 652.14 | 4.38021 | 6.63 |
| 21.0952 | 2542.88 | 4.21156 | 25.85 |
| 25.3243 | 1101.67 | 3.51702 | 11.20 |
| 25.8102 | 1889.92 | 3.44905 | 19.21 |
| 26.5879 | 8340.52 | 3.35267 | 84.78 |
| 26.7826 | 7526.02 | 3.32599 | 76.50 |
| 27.1079 | 8450.38 | 3.28681 | 85.90 |
| 27.2413 | 9837.37 | 3.27373 | 100.00 |
| 29.1201 | 1437.84 | 3.06664 | 14.62 |
| 31.4399 | 924.04 | 2.84311 | 9.39 |
| 32.1768 | 1530.64 | 2.78196 | 15.56 |
| 36.1483 | 429.90 | 2.48285 | 4.37 |
| 37.2487 | 297.40 | 2.41199 | 3.02 |

TABLE 9

Sample 7: 10 g pigment G (20 mol % copper/80 mol % zinc) inventive

| Peak Number | Pos. [°2Th.] | Height [cts] | d-spacing [Å] | Rel. Int. [%] |
|---|---|---|---|---|
| 1 | 6.4318 | 1809.15 | 13.74256 | 27.25 |
| 2 | 7.1979 | 2460.62 | 12.28143 | 37.06 |
| 3 | 8.3278 | 372.59 | 10.61750 | 5.61 |
| 4 | 10.4132 | 2613.35 | 8.49547 | 39.36 |
| 5 | 13.0196 | 357.04 | 6.80002 | 5.38 |
| 6 | 13.8445 | 472.02 | 6.39665 | 7.12 |
| 7 | 14.6446 | 149.01 | 6.04891 | 2.24 |
| 8 | 15.5987 | 246.85 | 5.68101 | 3.72 |
| 9 | 16.7429 | 1026.28 | 5.29527 | 15.46 |
| 10 | 17.2542 | 1497.08 | 5.13948 | 22.55 |
| 11 | 17.7630 | 1019.68 | 4.99338 | 15.36 |

TABLE 9-continued

Sample 7: 10 g pigment G (20 mol % copper/80 mol % zinc) inventive

| Peak Number | Pos. [°2Th.] | Height [cts] | d-spacing [Å] | Rel. Int. [%] |
|---|---|---|---|---|
| 12 | 18.1909 | 1412.90 | 4.87690 | 21.28 |
| 13 | 19.7787 | 442.60 | 4.48881 | 6.67 |
| 14 | 20.9339 | 2287.15 | 4.24366 | 34.45 |
| 15 | 22.0941 | 262.75 | 4.02336 | 3.96 |
| 16 | 24.1541 | 1015.46 | 3.68470 | 15.29 |
| 17 | 25.8350 | 3085.77 | 3.44864 | 46.48 |
| 18 | 26.5067 | 6088.86 | 3.36276 | 91.71 |
| 19 | 27.2009 | 6639.46 | 3.27849 | 100.00 |
| 20 | 27.9145 | 5011.17 | 3.19629 | 75.48 |
| 21 | 28.4668 | 2595.33 | 3.13551 | 39.09 |
| 22 | 29.0268 | 1474.82 | 3.07629 | 22.21 |
| 23 | 30.2379 | 340.55 | 2.95577 | 5.13 |
| 24 | 34.6973 | 732.61 | 2.58543 | 11.03 |
| 25 | 36.1426 | 418.39 | 2.48529 | 6.30 |
| 26 | 37.3016 | 204.46 | 2.41069 | 3.08 |

TABLE 10

Sample 8: 10 g pigment H (30 mol % copper/70 mol % zinc) inventive

| Peak Number | Pos. [°2Th.] | Height [cts] | d-spacing [Å] | Rel. Int. [%] |
|---|---|---|---|---|
| 1 | 7.2465 | 839.77 | 12.19923 | 10.39 |
| 2 | 10.4024 | 2009.53 | 8.50424 | 24.85 |
| 3 | 12.9987 | 211.27 | 6.81088 | 2.61 |
| 4 | 17.2743 | 689.77 | 5.13355 | 8.53 |
| 5 | 18.2038 | 640.10 | 4.87345 | 7.92 |
| 6 | 19.7769 | 361.32 | 4.48923 | 4.47 |
| 7 | 21.1487 | 1480.58 | 4.19979 | 18.31 |
| 8 | 22.0575 | 412.22 | 4.02996 | 5.10 |
| 9 | 23.9960 | 367.27 | 3.70861 | 4.54 |
| 10 | 26.7289 | 8085.33 | 3.33531 | 100.00 |
| 11 | 27.8892 | 5468.39 | 3.19913 | 67.63 |
| 12 | 28.4829 | 4107.54 | 3.13378 | 50.80 |
| 13 | 31.7750 | 629.00 | 2.81622 | 7.78 |

TABLE 11

Sample 9: 10 g pigment I (40 mol % copper/60 mol % zinc) inventive

| Peak Number | Pos. [°2Th.] | Height [cts] | d-spacing [Å] | Rel. Int. [%] |
|---|---|---|---|---|
| 1 | 7.2160 | 2505.24 | 12.25076 | 35.61 |
| 2 | 8.3038 | 423.45 | 10.64821 | 6.02 |
| 3 | 10.3767 | 1319.28 | 8.52523 | 18.75 |
| 4 | 11.7975 | 363.79 | 7.50153 | 5.17 |
| 5 | 13.7891 | 530.80 | 6.42222 | 7.54 |
| 6 | 17.1853 | 1499.95 | 5.15993 | 21.32 |
| 7 | 17.7002 | 1495.99 | 5.01096 | 21.26 |
| 8 | 18.2223 | 1616.47 | 4.86856 | 22.97 |
| 9 | 19.7580 | 368.15 | 4.49348 | 5.23 |
| 10 | 21.0471 | 940.23 | 4.22108 | 13.36 |
| 11 | 24.0658 | 1160.97 | 3.69802 | 16.50 |
| 12 | 25.9115 | 4513.48 | 3.43864 | 64.15 |
| 13 | 26.6663 | 5932.97 | 3.34300 | 84.32 |
| 14 | 27.1478 | 6640.73 | 3.28479 | 94.38 |
| 15 | 27.9400 | 7036.01 | 3.19343 | 100.00 |
| 16 | 28.4768 | 3829.50 | 3.13444 | 54.43 |
| 17 | 30.3014 | 314.02 | 2.94972 | 4.46 |
| 18 | 31.4059 | 471.53 | 2.84847 | 6.70 |
| 19 | 34.5304 | 868.64 | 2.59754 | 12.35 |
| 20 | 36.2126 | 371.59 | 2.48064 | 5.28 |
| 21 | 38.5100 | 369.75 | 2.33778 | 5.26 |

TABLE 12

Sample 10: 10 g pigment J (50 mol % copper/50 mol % zinc) inventive

| Nr. | Pos. [°2Th.] | d-spacing [Å] | Int. Height [cts] | Rel. Int. [%] |
|---|---|---|---|---|
| 1 | 6.2732 | 14.08953 | 804.83 | 11.00 |
| 2 | 7.1870 | 12.30003 | 2194.78 | 29.99 |
| 3 | 8.3666 | 10.56840 | 363.82 | 4.97 |
| 4 | 10.4807 | 8.44086 | 1304.23 | 17.82 |
| 5 | 11.8041 | 7.49734 | 261.50 | 3.57 |
| 6 | 13.7999 | 6.41720 | 531.71 | 7.27 |
| 7 | 16.7948 | 5.27463 | 683.70 | 9.34 |
| 8 | 17.2367 | 5.14467 | 1404.77 | 19.19 |
| 9 | 17.7103 | 5.00813 | 1454.34 | 19.87 |
| 10 | 18.2340 | 4.86545 | 1290.74 | 17.64 |
| 11 | 19.6835 | 4.50658 | 356.50 | 4.87 |
| 12 | 20.5450 | 4.31951 | 376.83 | 5.15 |
| 13 | 21.0971 | 4.21120 | 798.88 | 10.92 |
| 14 | 23.7630 | 3.74134 | 686.55 | 9.38 |
| 15 | 24.1251 | 3.68906 | 1055.22 | 14.42 |
| 16 | 25.9349 | 3.43559 | 4319.19 | 59.02 |
| 17 | 26.6771 | 3.33890 | 4975.72 | 67.99 |
| 18 | 27.1252 | 3.28748 | 7318.60 | 100.00 |
| 19 | 27.8720 | 3.20106 | 6576.43 | 89.86 |
| 20 | 29.0601 | 3.07030 | 919.93 | 12.57 |
| 21 | 30.3544 | 2.94470 | 271.94 | 3.72 |
| 22 | 31.2666 | 2.86083 | 327.73 | 4.48 |
| 23 | 32.2201 | 2.77832 | 260.10 | 3.55 |
| 24 | 34.6795 | 2.58671 | 835.41 | 11.41 |
| 25 | 36.2522 | 2.47803 | 322.18 | 4.40 |
| 26 | 38.5761 | 2.33393 | 287.14 | 3.92 |
| 27 | 39.3726 | 2.28664 | 576.73 | 7.88 |

TABLE 13

Sample 11: 10 g pigment K (60 mol % copper/40 mol % zinc) inventive

| Peak Number | Pos. [°2Th.] | Height [cts] | d-spacing [Å] | Rel. Int. [%] |
|---|---|---|---|---|
| 1 | 7.1942 | 4334.39 | 12.28776 | 49.32 |
| 2 | 8.3526 | 913.07 | 10.58612 | 10.39 |
| 3 | 10.5617 | 1111.77 | 8.37634 | 12.65 |
| 4 | 11.8238 | 646.03 | 7.48490 | 7.35 |
| 5 | 13.8690 | 1215.75 | 6.38537 | 13.83 |
| 6 | 16.7383 | 839.74 | 5.29670 | 9.56 |
| 7 | 17.2791 | 2258.55 | 5.13212 | 25.70 |
| 8 | 17.7572 | 2404.86 | 4.99502 | 27.37 |
| 9 | 18.2569 | 2554.71 | 4.85941 | 29.07 |
| 10 | 19.7734 | 455.44 | 4.49000 | 5.18 |
| 11 | 20.5717 | 677.23 | 4.31755 | 7.71 |
| 12 | 21.3784 | 577.84 | 4.15642 | 6.58 |
| 13 | 24.1487 | 2200.73 | 3.68550 | 25.04 |
| 14 | 25.8557 | 5113.57 | 3.44593 | 58.19 |
| 15 | 26.9017 | 5336.03 | 3.31427 | 60.72 |
| 16 | 27.9201 | 8787.95 | 3.19566 | 100.00 |
| 17 | 28.4870 | 3457.22 | 3.13334 | 39.34 |
| 18 | 29.0902 | 1258.48 | 3.06973 | 14.32 |
| 19 | 30.1296 | 653.52 | 2.96615 | 7.44 |
| 20 | 31.3075 | 842.18 | 2.85719 | 9.58 |
| 21 | 34.6400 | 1515.97 | 2.58957 | 17.25 |
| 22 | 36.2508 | 625.85 | 2.47812 | 7.12 |
| 23 | 38.5389 | 606.78 | 2.33610 | 6.90 |
| 24 | 39.3680 | 685.76 | 2.28879 | 7.80 |

TABLE 14

Sample 12: 10 g pigment L (70 mol % copper/30 mol % zinc) inventive

| Nr. | Pos. [°2Th.] | d-spacing [Å] | Int. Height [cts] | Rel. Int. [%] |
|---|---|---|---|---|
| 1 | 7.2381 | 12.21334 | 3538.10 | 36.16 |
| 2 | 8.2945 | 10.66011 | 948.31 | 9.69 |
| 3 | 10.4759 | 8.44468 | 818.21 | 8.36 |
| 4 | 11.7706 | 7.51862 | 605.31 | 6.19 |
| 5 | 13.8323 | 6.40226 | 1253.65 | 12.81 |
| 6 | 16.7286 | 5.29975 | 755.47 | 7.72 |
| 7 | 17.2389 | 5.14401 | 2067.38 | 21.13 |
| 8 | 17.7581 | 4.99475 | 2419.24 | 24.73 |
| 9 | 18.2050 | 4.87314 | 2271.13 | 23.21 |
| 10 | 19.6982 | 4.50698 | 225.66 | 2.31 |
| 11 | 20.5009 | 4.33230 | 502.05 | 5.13 |
| 12 | 21.1611 | 4.19861 | 450.80 | 4.61 |
| 13 | 23.7124 | 3.74921 | 972.47 | 9.94 |
| 14 | 24.1520 | 3.68501 | 1989.55 | 20.34 |
| 15 | 25.8012 | 3.45308 | 5571.69 | 56.95 |
| 16 | 26.8777 | 3.31718 | 5658.41 | 57.84 |
| 17 | 27.3613 | 3.25694 | 5394.11 | 55.13 |
| 18 | 27.9211 | 3.19554 | 9783.61 | 100.00 |
| 19 | 28.0976 | 3.17588 | 8985.70 | 91.84 |
| 20 | 29.0108 | 3.07795 | 1495.48 | 15.29 |
| 21 | 30.1968 | 2.95971 | 660.86 | 6.75 |
| 22 | 31.2275 | 2.86433 | 960.62 | 9.82 |
| 23 | 34.6924 | 2.58578 | 1562.70 | 15.97 |
| 24 | 36.1986 | 2.48157 | 639.50 | 6.54 |
| 25 | 38.5428 | 2.33586 | 774.06 | 7.91 |
| 26 | 39.3966 | 2.28719 | 847.60 | 8.66 |

TABLE 15

Sample 13: 10 g pigment M (80 mol % copper/20 mol % zinc) inventive

| Peak Number | Pos. [°2Th.] | Height [cts] | d-spacing [Å] | Rel. Int. [%] |
|---|---|---|---|---|
| 1 | 7.2452 | 5584.85 | 12.20138 | 47.31 |
| 2 | 8.3279 | 1422.27 | 10.61745 | 12.05 |
| 3 | 10.4539 | 410.84 | 8.46248 | 3.48 |
| 4 | 11.8250 | 1014.45 | 7.48413 | 8.59 |
| 5 | 13.8696 | 1679.44 | 6.38513 | 14.23 |
| 6 | 15.1190 | 444.66 | 5.86014 | 3.77 |
| 7 | 16.7733 | 916.00 | 5.28574 | 7.76 |
| 8 | 17.3050 | 2941.68 | 5.12449 | 24.92 |
| 9 | 17.8126 | 2939.18 | 4.97961 | 24.90 |
| 10 | 18.2778 | 3241.31 | 4.85391 | 27.46 |
| 11 | 19.7499 | 368.02 | 4.49529 | 3.12 |
| 12 | 20.5220 | 518.33 | 4.32788 | 4.39 |
| 13 | 24.1354 | 3005.62 | 3.68750 | 25.46 |
| 14 | 25.8077 | 6285.92 | 3.45224 | 53.25 |
| 15 | 27.9581 | 11804.72 | 3.19140 | 100.00 |
| 16 | 28.9844 | 1423.98 | 3.08069 | 12.06 |
| 17 | 30.2000 | 1337.63 | 2.95940 | 11.33 |
| 18 | 31.2509 | 1650.82 | 2.86224 | 13.98 |
| 19 | 34.6827 | 2123.10 | 2.58649 | 17.99 |
| 20 | 36.2115 | 967.86 | 2.48072 | 8.20 |
| 21 | 38.5854 | 1070.24 | 2.33339 | 9.07 |
| 22 | 39.4198 | 1271.87 | 2.28590 | 10.77 |

TABLE 16

Sample 14: 10 g pigment N (90 mol % copper/10 mol % zinc) inventive

| Peak Number | Pos. [°2Th.] | Height [cts] | d-spacing [Å] | Rel. Int. [%] |
|---|---|---|---|---|
| 1 | 7.2063 | 3726.37 | 12.26723 | 47.84 |
| 2 | 8.3093 | 813.32 | 10.64118 | 10.44 |

TABLE 16-continued

Sample 14: 10 g pigment N (90 mol % copper/10 mol % zinc) inventive

| Peak Number | Pos. [°2Th.] | Height [cts] | d-spacing [Å] | Rel. Int. [%] |
|---|---|---|---|---|
| 3 | 10.6160 | 865.28 | 8.33359 | 11.11 |
| 4 | 11.8913 | 640.74 | 7.44258 | 8.23 |
| 5 | 13.8368 | 1010.08 | 6.40016 | 12.97 |
| 6 | 17.2470 | 1987.98 | 5.14162 | 25.52 |
| 7 | 17.7113 | 2302.02 | 5.00785 | 29.55 |
| 8 | 18.2312 | 2162.71 | 4.86620 | 27.76 |
| 9 | 19.7865 | 406.44 | 4.48708 | 5.22 |
| 10 | 20.5328 | 641.20 | 4.32564 | 8.23 |
| 11 | 22.0205 | 326.95 | 4.03664 | 4.20 |
| 12 | 24.0045 | 1930.67 | 3.70732 | 24.78 |
| 13 | 25.9058 | 4685.83 | 3.43938 | 60.15 |
| 14 | 26.8813 | 3889.93 | 3.31674 | 49.94 |
| 15 | 27.9278 | 7789.96 | 3.19480 | 100.00 |
| 16 | 28.2064 | 7141.40 | 3.16387 | 91.67 |
| 17 | 28.4922 | 5608.59 | 3.13278 | 72.00 |
| 18 | 30.4860 | 593.22 | 2.93228 | 7.62 |
| 19 | 31.4790 | 814.43 | 2.84202 | 10.45 |
| 20 | 34.5788 | 1228.47 | 2.59402 | 15.77 |
| 21 | 36.1001 | 299.45 | 2.48812 | 3.84 |
| 22 | 38.4758 | 549.23 | 2.33978 | 7.05 |

TABLE 17

Sample 15: 10 g pigment O (94 mol % copper/6 mol % zinc) inventive

| Peak Number | Pos. [°2Th.] | Height [cts] | d-spacing [Å] | Rel. Int. [%] |
|---|---|---|---|---|
| 1 | 7.1967 | 5435.33 | 12.28359 | 53.30 |
| 2 | 8.3413 | 1366.32 | 10.60033 | 13.40 |
| 3 | 10.5711 | 668.43 | 8.36887 | 6.55 |
| 4 | 11.8382 | 872.14 | 7.47584 | 8.55 |
| 5 | 13.8740 | 1491.54 | 6.38309 | 14.63 |
| 6 | 16.7811 | 865.60 | 5.28329 | 8.49 |
| 7 | 17.2674 | 2706.97 | 5.13557 | 26.54 |
| 8 | 17.7593 | 3074.07 | 4.99443 | 30.14 |
| 9 | 18.2613 | 2969.43 | 4.85826 | 29.12 |
| 10 | 19.7707 | 582.04 | 4.49062 | 5.71 |
| 11 | 20.5533 | 515.91 | 4.32136 | 5.06 |
| 12 | 21.9760 | 262.96 | 4.04471 | 2.58 |
| 13 | 24.1576 | 2687.10 | 3.68417 | 26.35 |
| 14 | 25.8206 | 5230.21 | 3.45053 | 51.28 |
| 15 | 26.8646 | 3746.17 | 3.31876 | 36.73 |
| 16 | 27.9186 | 10198.52 | 3.19583 | 100.00 |
| 17 | 28.5034 | 4939.11 | 3.13157 | 48.43 |
| 18 | 30.2582 | 1050.35 | 2.95384 | 10.30 |
| 19 | 31.3156 | 1348.81 | 2.85648 | 13.23 |
| 20 | 34.6446 | 1643.91 | 2.58924 | 16.12 |
| 21 | 36.1779 | 678.78 | 2.48294 | 6.66 |
| 22 | 38.5718 | 770.05 | 2.33418 | 7.55 |
| 23 | 39.4562 | 866.78 | 2.28387 | 8.50 |

TABLE 18

Sample 16: 0.05 g pigment A and 9.95 g pigment B (physical mixture of 0.5 mol % copper and 99.5 mol % zinc) inventive

| Peak Number | Pos. [°2Th.] | Height [cts] | d-spacing [Å] | Rel. Int. [%] |
|---|---|---|---|---|
| 1 | 5.0066 | 374.72 | 17.63641 | 6.06 |
| 2 | 5.0190 | 187.36 | 17.63641 | 3.03 |
| 3 | 6.4673 | 673.11 | 13.65597 | 10.88 |
| 4 | 6.4833 | 336.55 | 13.65597 | 5.44 |
| 5 | 10.3592 | 869.13 | 8.53252 | 14.04 |
| 6 | 10.3850 | 434.57 | 8.53252 | 7.02 |
| 7 | 12.5982 | 67.62 | 7.02066 | 1.09 |
| 8 | 12.6296 | 33.81 | 7.02066 | 0.55 |

TABLE 18-continued

Sample 16: 0.05 g pigment A and 9.95 g pigment B (physical mixture of 0.5 mol % copper and 99.5 mol % zinc) inventive

| Peak Number | Pos. [°2Th.] | Height [cts] | d-spacing [Å] | Rel. Int. [%] |
|---|---|---|---|---|
| 9 | 15.2012 | 785.61 | 5.82381 | 12.69 |
| 10 | 15.2392 | 392.80 | 5.82381 | 6.35 |
| 11 | 16.8993 | 528.20 | 5.24226 | 8.54 |
| 12 | 16.9416 | 264.10 | 5.24226 | 4.27 |
| 13 | 18.7815 | 180.54 | 4.72093 | 2.92 |
| 14 | 18.8286 | 90.27 | 4.72093 | 1.46 |
| 15 | 20.8140 | 743.54 | 4.26429 | 12.02 |
| 16 | 20.8663 | 371.77 | 4.26429 | 6.01 |
| 17 | 25.6520 | 729.96 | 3.46996 | 11.80 |
| 18 | 25.7168 | 364.98 | 3.46996 | 5.90 |
| 19 | 27.2340 | 6188.34 | 3.27187 | 100.00 |
| 20 | 27.3030 | 3094.17 | 3.27187 | 50.00 |
| 21 | 27.8257 | 2248.19 | 3.20363 | 36.33 |
| 22 | 27.8963 | 1124.10 | 3.20363 | 18.16 |
| 23 | 31.4610 | 186.15 | 2.84125 | 3.01 |
| 24 | 31.5412 | 93.07 | 2.84125 | 1.50 |
| 25 | 34.9445 | 428.56 | 2.56558 | 6.93 |
| 26 | 35.0341 | 214.28 | 2.56558 | 3.46 |
| 27 | 36.0103 | 529.81 | 2.49205 | 8.56 |
| 28 | 36.1028 | 264.90 | 2.49205 | 4.28 |

TABLE 19

Sample 17: 0.2 g pigment A and 9.8 g pigment B (physical mixture of 2 mol % copper and 98 mol % zinc) inventive

| Peak Number | Pos. [°2Th.] | Height [cts] | d-spacing [Å] | Rel. Int. [%] |
|---|---|---|---|---|
| 1 | 5.4731 | 0.00 | 16.13407 | 0.00 |
| 2 | 5.4867 | 0.00 | 16.13407 | 0.00 |
| 3 | 6.4249 | 626.16 | 13.74600 | 8.59 |
| 4 | 6.4408 | 313.08 | 13.74600 | 4.30 |
| 5 | 10.3096 | 841.56 | 8.57346 | 11.55 |
| 6 | 10.3353 | 420.78 | 8.57346 | 5.77 |
| 7 | 15.1837 | 732.31 | 5.83051 | 10.05 |
| 8 | 15.2216 | 366.16 | 5.83051 | 5.02 |
| 9 | 16.9792 | 476.51 | 5.21776 | 6.54 |
| 10 | 17.0217 | 238.26 | 5.21776 | 3.27 |
| 11 | 18.7871 | 158.94 | 4.71953 | 2.18 |
| 12 | 18.8343 | 79.47 | 4.71953 | 1.09 |
| 13 | 20.4050 | 386.58 | 4.34883 | 5.30 |
| 14 | 20.4563 | 193.29 | 4.34883 | 2.65 |
| 15 | 20.8641 | 565.41 | 4.25416 | 7.76 |
| 16 | 20.9165 | 282.70 | 4.25416 | 3.88 |
| 17 | 23.8660 | 77.00 | 3.72544 | 1.06 |
| 18 | 23.9261 | 38.50 | 3.72544 | 0.53 |
| 19 | 25.8584 | 1070.60 | 3.44272 | 14.69 |
| 20 | 25.9238 | 535.30 | 3.44272 | 7.34 |
| 21 | 27.2348 | 7288.96 | 3.27178 | 100.00 |
| 22 | 27.3038 | 3644.48 | 3.27178 | 50.00 |
| 23 | 28.1653 | 1934.59 | 3.16577 | 26.54 |
| 24 | 28.2368 | 967.30 | 3.16577 | 13.27 |
| 25 | 31.4736 | 179.11 | 2.84014 | 2.46 |
| 26 | 31.5539 | 89.55 | 2.84014 | 1.23 |
| 27 | 34.6548 | 328.27 | 2.58636 | 4.50 |
| 28 | 34.7436 | 164.13 | 2.58636 | 2.25 |
| 29 | 36.0524 | 448.34 | 2.48924 | 6.15 |
| 30 | 36.1451 | 224.17 | 2.48924 | 3.08 |

TABLE 20

Sample 18: 0.6 g pigment A and 9.4 g pigment B (physical mixture of 6 mol % copper and 94 mol % zinc) inventive

| Peak Number | Pos. [°2Th.] | Height [cts] | d-spacing [Å] | Rel. Int. [%] |
|---|---|---|---|---|
| 1 | 6.3313 | 2281.58 | 13.96036 | 16.53 |
| 2 | 10.3842 | 2417.90 | 8.51912 | 17.51 |
| 3 | 11.1569 | 648.44 | 7.93074 | 4.70 |
| 4 | 12.9719 | 359.22 | 6.82490 | 2.60 |
| 5 | 14.8173 | 410.12 | 5.97881 | 2.97 |
| 6 | 15.4724 | 257.94 | 5.72709 | 1.87 |
| 7 | 16.4361 | 1033.65 | 5.39342 | 7.49 |
| 8 | 17.3462 | 558.26 | 5.11243 | 4.04 |
| 9 | 18.1871 | 266.28 | 4.87790 | 1.93 |
| 10 | 20.0569 | 704.88 | 4.42719 | 5.11 |
| 11 | 20.8790 | 1920.46 | 4.25468 | 13.91 |
| 12 | 22.0595 | 317.86 | 4.02960 | 2.30 |
| 13 | 24.0310 | 157.82 | 3.70330 | 1.14 |
| 14 | 25.3343 | 1757.45 | 3.51566 | 12.73 |
| 15 | 26.5444 | 10318.39 | 3.35807 | 74.75 |
| 16 | 27.0838 | 13804.76 | 3.29240 | 100.00 |
| 17 | 27.8872 | 3794.16 | 3.19935 | 27.48 |
| 18 | 28.4839 | 2779.37 | 3.13367 | 20.13 |
| 19 | 28.9531 | 1950.87 | 3.08394 | 14.13 |
| 20 | 31.4723 | 876.32 | 2.84260 | 6.35 |
| 21 | 32.0291 | 1042.57 | 2.79445 | 7.55 |
| 22 | 35.0939 | 349.26 | 2.55711 | 2.53 |
| 23 | 36.0890 | 318.86 | 2.48885 | 2.31 |
| 24 | 37.0793 | 361.23 | 2.42463 | 2.62 |

TABLE 21

Sample 19: 1.0 g pigment A and 9.0 g pigment B (physical mixture of 10 mol % copper and 90 mol % zinc) inventive

| Peak Number | Pos. [°2Th.] | Height [cts] | d-spacing [Å] | Rel. Int. [%] |
|---|---|---|---|---|
| 1 | 6.3918 | 2474.85 | 13.82851 | 20.74 |
| 2 | 6.9854 | 1321.60 | 12.65458 | 11.07 |
| 3 | 10.4135 | 2440.69 | 8.49518 | 20.45 |
| 4 | 11.1861 | 664.52 | 7.91014 | 5.57 |
| 5 | 12.9088 | 274.63 | 6.85814 | 2.30 |
| 6 | 14.6503 | 348.64 | 6.04658 | 2.92 |
| 7 | 15.4626 | 282.44 | 5.73072 | 2.37 |
| 8 | 16.4162 | 1059.97 | 5.39990 | 8.88 |
| 9 | 17.3533 | 635.30 | 5.11036 | 5.32 |
| 10 | 18.1701 | 334.49 | 4.88242 | 2.80 |
| 11 | 20.0092 | 660.46 | 4.43762 | 5.53 |
| 12 | 20.8438 | 1830.25 | 4.26180 | 15.34 |
| 13 | 21.2291 | 1419.21 | 4.18530 | 11.89 |
| 14 | 22.0699 | 204.97 | 4.02772 | 1.72 |
| 15 | 23.9551 | 190.05 | 3.71485 | 1.59 |
| 16 | 25.3712 | 1823.51 | 3.51062 | 15.28 |
| 17 | 26.4857 | 8910.41 | 3.36538 | 74.67 |
| 18 | 27.2073 | 11933.22 | 3.27773 | 100.00 |
| 19 | 27.8934 | 3988.06 | 3.19866 | 33.42 |
| 20 | 28.4803 | 2990.24 | 3.13406 | 25.06 |
| 21 | 29.0148 | 1880.99 | 3.07753 | 15.76 |
| 22 | 31.4455 | 796.83 | 2.84496 | 6.68 |
| 23 | 32.0576 | 1010.25 | 2.79203 | 8.47 |
| 24 | 35.1343 | 254.22 | 2.55426 | 2.13 |
| 25 | 36.0968 | 295.22 | 2.48834 | 2.47 |
| 26 | 37.0593 | 249.71 | 2.42589 | 2.09 |

TABLE 22

Sample 20: 2.0 g pigment A and 8.0 g pigment B (physical mixture of 20 mol % copper and 80 mol % zinc) inventive

| Peak Number | Pos. [°2Th.] | Height [cts] | d-spacing [Å] | Rel. Int. [%] |
|---|---|---|---|---|
| 1 | 6.3455 | 2165.11 | 13.92925 | 18.32 |
| 2 | 7.2136 | 1173.73 | 12.25482 | 9.93 |
| 3 | 8.2939 | 118.81 | 10.66086 | 1.01 |
| 4 | 10.5679 | 2040.81 | 8.37140 | 17.27 |
| 5 | 12.8576 | 222.61 | 6.88533 | 1.88 |
| 6 | 14.7343 | 359.54 | 6.01228 | 3.04 |
| 7 | 15.4652 | 314.43 | 5.72975 | 2.66 |
| 8 | 16.4152 | 977.72 | 5.40022 | 8.27 |
| 9 | 17.2837 | 818.65 | 5.13078 | 6.93 |
| 10 | 18.1656 | 424.24 | 4.88362 | 3.59 |
| 11 | 20.0170 | 621.01 | 4.43591 | 5.25 |
| 12 | 20.9157 | 1734.87 | 4.24730 | 14.68 |
| 13 | 24.0644 | 454.26 | 3.69822 | 3.84 |
| 14 | 26.5944 | 9461.71 | 3.35187 | 80.06 |
| 15 | 27.0564 | 11818.96 | 3.29568 | 100.00 |
| 16 | 27.2638 | 9590.21 | 3.27107 | 81.14 |
| 17 | 27.8687 | 4611.58 | 3.20144 | 39.02 |
| 18 | 28.5040 | 3147.95 | 3.13151 | 26.63 |
| 19 | 28.9624 | 1854.81 | 3.08298 | 15.69 |
| 20 | 30.1756 | 231.46 | 2.96174 | 1.96 |
| 21 | 31.4362 | 783.69 | 2.84579 | 6.63 |
| 22 | 32.0438 | 861.63 | 2.79320 | 7.29 |
| 23 | 36.0798 | 175.14 | 2.48947 | 1.48 |
| 24 | 37.2340 | 196.04 | 2.41491 | 1.66 |

TABLE 23

Sample 21: 3.0 g pigment A and 7.0 g pigment B (physical mixture of 30 mol % copper and 70 mol % zinc) inventive

| Peak Number | Pos. [°2Th.] | Height [cts] | d-spacing [Å] | Rel. Int. [%] |
|---|---|---|---|---|
| 1 | 6.3250 | 1818.51 | 13.97425 | 17.95 |
| 2 | 7.2050 | 1458.99 | 12.26935 | 14.40 |
| 3 | 8.2931 | 184.80 | 10.66187 | 1.82 |
| 4 | 10.4644 | 1952.88 | 8.45397 | 19.28 |
| 5 | 11.1671 | 523.75 | 7.92353 | 5.17 |
| 6 | 12.9654 | 181.88 | 6.82830 | 1.80 |
| 7 | 13.8842 | 237.61 | 6.37843 | 2.35 |
| 8 | 14.6810 | 200.05 | 6.03400 | 1.97 |
| 9 | 15.5460 | 171.22 | 5.70015 | 1.69 |
| 10 | 16.4167 | 736.95 | 5.39975 | 7.27 |
| 11 | 17.2909 | 815.92 | 5.12865 | 8.05 |
| 12 | 18.2217 | 618.48 | 4.86871 | 6.10 |
| 13 | 19.8884 | 444.39 | 4.46430 | 4.39 |
| 14 | 20.8561 | 1513.35 | 4.25931 | 14.94 |
| 15 | 21.1659 | 1323.04 | 4.19765 | 13.06 |
| 16 | 22.0775 | 316.14 | 4.02636 | 3.12 |
| 17 | 24.0645 | 626.53 | 3.69820 | 6.18 |
| 18 | 25.8317 | 3633.82 | 3.44908 | 35.87 |
| 19 | 26.6610 | 9483.99 | 3.34365 | 93.61 |
| 20 | 27.2262 | 10131.38 | 3.27551 | 100.00 |
| 21 | 27.9040 | 5236.33 | 3.19747 | 51.68 |
| 22 | 28.5297 | 3349.69 | 3.12874 | 33.06 |
| 23 | 29.0755 | 1635.13 | 3.07125 | 16.14 |
| 24 | 30.2617 | 165.40 | 2.95350 | 1.63 |
| 25 | 31.4905 | 777.58 | 2.84100 | 7.67 |
| 26 | 32.0845 | 736.64 | 2.78975 | 7.27 |
| 27 | 34.7143 | 163.32 | 2.58420 | 1.61 |
| 28 | 36.2290 | 190.10 | 2.47956 | 1.88 |

TABLE 24

Sample 22: 4.0 g pigment A and 6.0 g pigment B (physical mixture of 40 mol % copper and 60 mol % zinc) inventive

| Peak Number | Pos. [°2Th.] | Height [cts] | d-spacing [Å] | Rel. Int. [%] |
|---|---|---|---|---|
| 1 | 6.3250 | 1508.06 | 13.97441 | 14.99 |
| 2 | 7.1844 | 1743.33 | 12.30455 | 17.33 |
| 3 | 8.2928 | 250.38 | 10.66232 | 2.49 |
| 4 | 10.4673 | 1742.73 | 8.45165 | 17.32 |
| 5 | 11.8397 | 185.62 | 7.47485 | 1.84 |
| 6 | 13.8264 | 422.22 | 6.40497 | 4.20 |
| 7 | 14.8186 | 174.77 | 5.97829 | 1.74 |
| 8 | 16.4236 | 688.34 | 5.39748 | 6.84 |
| 9 | 17.2602 | 1019.38 | 5.13770 | 10.13 |
| 10 | 18.1871 | 875.43 | 4.87790 | 8.70 |
| 11 | 19.8064 | 500.74 | 4.48261 | 4.98 |
| 12 | 20.9140 | 1432.78 | 4.24764 | 14.24 |
| 13 | 22.0695 | 361.20 | 4.02780 | 3.59 |
| 14 | 24.1232 | 758.91 | 3.68934 | 7.54 |
| 15 | 25.9586 | 4206.87 | 3.43250 | 41.81 |
| 16 | 26.5856 | 8118.70 | 3.35295 | 80.69 |
| 17 | 27.1130 | 10061.49 | 3.28892 | 100.00 |
| 18 | 27.9092 | 5977.85 | 3.19688 | 59.41 |
| 19 | 28.4844 | 4292.48 | 3.13362 | 42.66 |
| 20 | 30.2620 | 163.71 | 2.95347 | 1.63 |
| 21 | 31.4295 | 701.52 | 2.84638 | 6.97 |
| 22 | 34.6677 | 370.54 | 2.58757 | 3.68 |
| 23 | 36.1038 | 224.89 | 2.48787 | 2.24 |

TABLE 25

Sample 23: 5.0 g pigment A and 5.0 g pigment B (physical mixture of 50 mol % copper and 50 mol % zinc) inventive

| Peak Number | Pos. [°2Th.] | Height [cts] | d-spacing [Å] | Rel. Int. [%] |
|---|---|---|---|---|
| 1 | 6.3742 | 1355.88 | 13.86652 | 15.72 |
| 2 | 7.1873 | 2059.97 | 12.29963 | 23.88 |
| 3 | 8.2935 | 353.91 | 10.66134 | 4.10 |
| 4 | 10.4341 | 1571.82 | 8.47845 | 18.22 |
| 5 | 11.8007 | 244.96 | 7.49951 | 2.84 |
| 6 | 13.8218 | 528.23 | 6.40707 | 6.12 |
| 7 | 15.1311 | 44.49 | 5.85550 | 0.52 |
| 8 | 16.4619 | 633.01 | 5.38499 | 7.34 |
| 9 | 17.2531 | 1243.56 | 5.13981 | 14.41 |
| 10 | 17.6754 | 1052.68 | 5.01794 | 12.20 |
| 11 | 18.1849 | 1171.93 | 4.87847 | 13.58 |
| 12 | 19.7557 | 469.43 | 4.49399 | 5.44 |
| 13 | 20.9425 | 1159.52 | 4.24192 | 13.44 |
| 14 | 22.0609 | 358.15 | 4.02934 | 4.15 |
| 15 | 24.0658 | 1053.46 | 3.69801 | 12.21 |
| 16 | 25.8945 | 4308.45 | 3.44085 | 49.94 |
| 17 | 26.6391 | 7590.42 | 3.34634 | 87.98 |
| 18 | 27.1420 | 8627.25 | 3.28548 | 100.00 |
| 19 | 27.8921 | 6462.61 | 3.19880 | 74.91 |
| 20 | 28.4615 | 4575.92 | 3.13609 | 53.04 |
| 21 | 30.2165 | 268.95 | 2.95782 | 3.12 |
| 22 | 31.3439 | 653.41 | 2.85396 | 7.57 |
| 23 | 34.6228 | 599.36 | 2.59082 | 6.95 |
| 24 | 36.1290 | 249.92 | 2.48619 | 2.90 |

TABLE 26

Sample 24: 6.0 g pigment A and 4.0 g pigment B (physical mixture of 60 mol % copper and 40 mol % zinc) inventive

| Peak Number | Pos. [°2Th.] | Height [cts] | d-spacing [Å] | Rel. Int. [%] |
|---|---|---|---|---|
| 1 | 6.3520 | 1229.59 | 13.91507 | 16.30 |
| 2 | 7.1968 | 2358.90 | 12.28342 | 31.26 |
| 3 | 8.3004 | 395.71 | 10.65251 | 5.24 |
| 4 | 10.5076 | 1355.50 | 8.41928 | 17.97 |

TABLE 26-continued

Sample 24: 6.0 g pigment A and 4.0 g pigment B (physical mixture of 60 mol % copper and 40 mol % zinc) inventive

| Peak Number | Pos. [°2Th.] | Height [cts] | d-spacing [Å] | Rel. Int. [%] |
|---|---|---|---|---|
| 5 | 11.8277 | 292.39 | 7.48241 | 3.88 |
| 6 | 13.8333 | 549.29 | 6.40178 | 7.28 |
| 7 | 16.6425 | 718.48 | 5.32698 | 9.52 |
| 8 | 17.2620 | 1298.64 | 5.13718 | 17.21 |
| 9 | 17.7257 | 1352.88 | 5.00383 | 17.93 |
| 10 | 18.2151 | 1304.32 | 4.87047 | 17.29 |
| 11 | 21.0892 | 942.04 | 4.21275 | 12.49 |
| 12 | 22.0678 | 408.59 | 4.02809 | 5.42 |
| 13 | 24.0734 | 1163.83 | 3.69686 | 15.42 |
| 14 | 25.8980 | 4266.75 | 3.44040 | 56.55 |
| 15 | 26.6216 | 6502.72 | 3.34851 | 86.18 |
| 16 | 27.1347 | 7545.20 | 3.28634 | 100.00 |
| 17 | 27.9116 | 6734.56 | 3.19661 | 89.26 |
| 18 | 28.5050 | 4578.78 | 3.13140 | 60.68 |
| 19 | 30.2617 | 317.49 | 2.95350 | 4.21 |
| 20 | 31.4265 | 724.66 | 2.84664 | 9.60 |
| 21 | 34.5843 | 600.53 | 2.59362 | 7.96 |
| 22 | 36.2006 | 226.31 | 2.48144 | 3.00 |
| 23 | 38.5550 | 208.29 | 2.33516 | 2.76 |

TABLE 27

Sample 25: 7.0 g pigment A and 3.0 g pigment B (physical mixture of 70 mol % copper and 30 mol % zinc) inventive

| Peak Number | Pos. [°2Th.] | Height [cts] | d-spacing [Å] | Rel. Int. [%] |
|---|---|---|---|---|
| 1 | 6.4118 | 1153.78 | 13.78546 | 15.65 |
| 2 | 7.2045 | 2669.82 | 12.27027 | 36.22 |
| 3 | 8.3000 | 509.00 | 10.65306 | 6.90 |
| 4 | 10.4359 | 1190.82 | 8.47703 | 16.15 |
| 5 | 11.8520 | 371.87 | 7.46714 | 5.04 |
| 6 | 13.8217 | 694.22 | 6.40715 | 9.42 |
| 7 | 17.2822 | 1499.61 | 5.13122 | 20.34 |
| 8 | 17.7154 | 1596.29 | 5.00670 | 21.65 |
| 9 | 18.2123 | 1429.06 | 4.87119 | 19.38 |
| 10 | 19.8170 | 418.33 | 4.48024 | 5.67 |
| 11 | 20.7214 | 792.59 | 4.28669 | 10.75 |
| 12 | 22.0866 | 369.69 | 4.02471 | 5.01 |
| 13 | 24.1146 | 1329.30 | 3.69064 | 18.03 |
| 14 | 25.8688 | 4264.46 | 3.44421 | 57.85 |
| 15 | 26.6693 | 5999.24 | 3.34262 | 81.38 |
| 16 | 27.0538 | 6814.95 | 3.29598 | 92.44 |
| 17 | 27.9203 | 7372.03 | 3.19563 | 100.00 |
| 18 | 28.5016 | 4982.85 | 3.13177 | 67.59 |
| 19 | 30.2431 | 349.05 | 2.95528 | 4.73 |
| 20 | 31.4582 | 713.16 | 2.84385 | 9.67 |
| 21 | 34.6608 | 718.96 | 2.58807 | 9.75 |
| 22 | 36.1947 | 381.69 | 2.48183 | 5.18 |
| 23 | 38.5652 | 323.59 | 2.33456 | 4.39 |
| 24 | 39.3002 | 474.31 | 2.29258 | 6.43 |

TABLE 28

Sample 26: 8.0 g pigment A and 2.0 g pigment B (physical mixture of 80 mol % copper and 20 mol % zinc) inventive

| Peak Number | Pos. [°2Th.] | Height [cts] | d-spacing [Å] | Rel. Int. [%] |
|---|---|---|---|---|
| 1 | 7.1736 | 3055.44 | 12.32300 | 39.07 |
| 2 | 8.3027 | 693.01 | 10.64961 | 8.86 |
| 3 | 10.3681 | 966.90 | 8.53229 | 12.36 |
| 4 | 11.8485 | 464.33 | 7.46933 | 5.94 |
| 5 | 13.8476 | 797.50 | 6.39523 | 10.20 |
| 6 | 17.2646 | 1588.75 | 5.13639 | 20.31 |
| 7 | 17.7574 | 1695.70 | 4.99496 | 21.68 |
| 8 | 18.2119 | 1660.18 | 4.87130 | 21.23 |

TABLE 28-continued

Sample 26: 8.0 g pigment A and 2.0 g pigment B (physical mixture of 80 mol % copper and 20 mol % zinc) inventive

| Peak Number | Pos. [°2Th.] | Height [cts] | d-spacing [Å] | Rel. Int. [%] |
|---|---|---|---|---|
| 9 | 19.7901 | 464.73 | 4.48626 | 5.94 |
| 10 | 20.6311 | 632.64 | 4.30524 | 8.09 |
| 11 | 24.1009 | 1677.70 | 3.69271 | 21.45 |
| 12 | 25.9128 | 4767.88 | 3.43847 | 60.96 |
| 13 | 26.7783 | 5681.88 | 3.32927 | 72.65 |
| 14 | 27.0252 | 5907.92 | 3.29941 | 75.54 |
| 15 | 27.9301 | 7821.03 | 3.19453 | 100.00 |
| 16 | 28.4851 | 5438.38 | 3.13354 | 69.53 |
| 17 | 30.2360 | 445.73 | 2.95596 | 5.70 |
| 18 | 31.4464 | 790.60 | 2.84489 | 10.11 |
| 19 | 34.7089 | 846.92 | 2.58459 | 10.83 |
| 20 | 36.1959 | 393.37 | 2.48175 | 5.03 |
| 21 | 38.5885 | 301.64 | 2.33321 | 3.86 |

TABLE 29

Sample 27: 9.0 g pigment A and 1.0 g pigment B (physical mixture of 90 mol % copper and 10 mol % zinc) inventive

| Peak Number | Pos. [°2Th.] | Height [cts] | d-spacing [Å] | Rel. Int. [%] |
|---|---|---|---|---|
| 1 | 7.2438 | 2978.94 | 12.20375 | 35.85 |
| 2 | 8.2997 | 597.29 | 10.65348 | 7.19 |
| 3 | 10.4138 | 818.06 | 8.49493 | 9.84 |
| 4 | 11.8301 | 483.66 | 7.48094 | 5.82 |
| 5 | 13.7954 | 1003.71 | 6.41927 | 12.08 |
| 6 | 16.7081 | 634.36 | 5.30622 | 7.63 |
| 7 | 17.2669 | 1677.71 | 5.13572 | 20.19 |
| 8 | 17.7104 | 1929.85 | 5.00809 | 23.22 |
| 9 | 18.2360 | 1876.79 | 4.86494 | 22.58 |
| 10 | 19.7670 | 367.37 | 4.49145 | 4.42 |
| 11 | 20.5166 | 633.88 | 4.32902 | 7.63 |
| 12 | 22.0739 | 502.46 | 4.02701 | 6.05 |
| 13 | 24.0786 | 1759.72 | 3.69608 | 21.17 |
| 14 | 25.9734 | 5031.03 | 3.43058 | 60.54 |
| 15 | 26.9899 | 5288.86 | 3.30364 | 63.64 |
| 16 | 27.9149 | 8310.34 | 3.19624 | 100.00 |
| 17 | 28.4936 | 5610.10 | 3.13263 | 67.51 |
| 18 | 30.2853 | 534.17 | 2.95126 | 6.43 |
| 19 | 31.4675 | 834.42 | 2.84303 | 10.04 |
| 20 | 34.6489 | 988.00 | 2.58893 | 11.89 |
| 21 | 36.2166 | 342.02 | 2.48038 | 4.12 |
| 22 | 38.4879 | 412.43 | 2.33907 | 4.96 |

TABLE 30

Sample 28: 9.4 g pigment A and 0.6 g pigment B (physical mixture of 94 mol % copper and 6 mol % zinc) inventive

| Peak Number | Pos. [°2Th.] | Height [cts] | d-spacing [Å] | Rel. Int. [%] |
|---|---|---|---|---|
| 1 | 7.1753 | 3350.61 | 12.32014 | 38.97 |
| 2 | 8.2817 | 668.11 | 10.67651 | 7.77 |
| 3 | 10.5265 | 806.23 | 8.40426 | 9.38 |
| 4 | 11.8039 | 604.03 | 7.49745 | 7.02 |
| 5 | 13.6935 | 880.36 | 6.46684 | 10.24 |
| 6 | 16.6458 | 592.72 | 5.32592 | 6.89 |
| 7 | 17.2455 | 1742.37 | 5.14204 | 20.26 |
| 8 | 17.7072 | 1926.66 | 5.00899 | 22.41 |
| 9 | 18.2064 | 1871.84 | 4.87277 | 21.77 |
| 10 | 19.7574 | 423.71 | 4.49362 | 4.93 |
| 11 | 20.5220 | 596.50 | 4.32789 | 6.94 |
| 12 | 22.0690 | 489.01 | 4.02788 | 5.69 |
| 13 | 24.0892 | 1772.40 | 3.69447 | 20.61 |
| 14 | 25.8122 | 4513.94 | 3.45164 | 52.50 |
| 15 | 25.9620 | 5143.24 | 3.43207 | 59.81 |
| 16 | 26.8991 | 4855.01 | 3.31459 | 56.46 |

TABLE 30-continued

Sample 28: 9.4 g pigment A and 0.6 g pigment B (physical mixture of 94 mol % copper and 6 mol % zinc) inventive

| Peak Number | Pos. [°2Th.] | Height [cts] | d-spacing [Å] | Rel. Int. [%] |
|---|---|---|---|---|
| 17 | 27.8947 | 8598.58 | 3.19850 | 100.00 |
| 18 | 28.4773 | 5937.78 | 3.13438 | 69.06 |
| 19 | 30.2362 | 496.99 | 2.95594 | 5.78 |
| 20 | 31.4281 | 914.98 | 2.84651 | 10.64 |
| 21 | 32.7448 | 198.80 | 2.73499 | 2.31 |
| 22 | 34.6599 | 1045.66 | 2.58813 | 12.16 |
| 23 | 36.2789 | 294.79 | 2.47626 | 3.43 |
| 24 | 38.5696 | 462.48 | 2.33431 | 5.38 |
| 25 | 39.5361 | 747.29 | 2.27944 | 8.69 |

What is claimed is:

1. Metal azo pigments comprising:

a) at least two metal azo compounds which differ at least in the type of metal and which each contain structural units of the formula (I), or the tautomeric forms thereof,

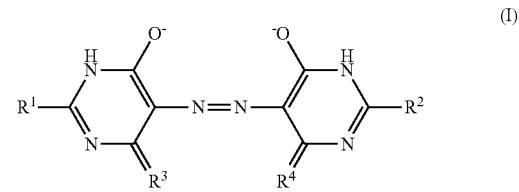

in which $R^1$ and $R^2$ are each independently OH, $NH_2$ or $NHR^5$, $R^3$ and $R^4$ are each independently $=O$ or $=NR^5$, and $R^5$ is hydrogen or alkyl, and metal ions comprising $Zn^{2+}$ and/ $Cu^{2+}$ metal ions, and optionally at least one further metal ion Me, where Me is a di- or trivalent metal ion other than $Zn^{2+}$ and $Cu^{2+}$, with the proviso that the amount of $Zn^{2+}$ and $Cu^{2+}$ metal ions together is 95 to 100 mol % and, if used, the amount of di- or trivalent metal ions other than $Zn^{2+}$ and $Cu^{2+}$ is 0 to 5 mol %, based in each case on one mole of all metal ions in the metal azo pigment, and where the molar ratio of $Zn^{2+}$ to $Cu^{2+}$ metal ions in the metal azo pigment is 199:1 to 1:15, and b) at least one compound of the formula (II)

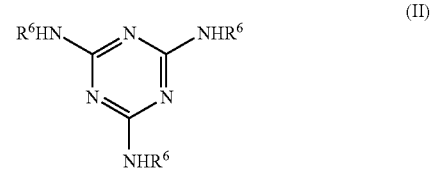

in which $R^6$ is hydrogen or alkyl.

2. The metal azo pigments according to claim 1, wherein:
the molar ratio of $Zn^{2+}$ to $Cu^{2+}$ metal ions in the metal azo pigment is 19:1 to 1:1,
$R^5$ is hydrogen or $C_1$-$C_4$-alkyl, and
$R^6$ is hydrogen, or $C_1$-$C_4$-alkyl, or $C_1$-$C_4$-alkyl mono- or polysubstituted by OH.

3. The metal azo pigments according to claim 2, wherein:
$R^1$ and $R^2$ are OH;
$R^3$ and $R^4$ are =O;
$R^6$ is hydrogen;
components a) and components b) are present together in the form of adducts;
the amount of $Cu^{2+}$ and $Zn^{2+}$ metal ions together is 100 mol %, based on one mole of all metal ions;
the molar ratio of $Zn^{2+}$ to $C^{2+}$ metal ions in the metal azo pigment is 9:1 to 2:1;
1.0 to 2.0 mol of compounds of the formula (II) is present per mole of structural units of the formula (I); and
the pigments have a specific surface area of 90 to 150 $m^2/g$.

4. The metal azo pigments according to claim 1, wherein components a) and components b) are present together in the form of adducts.

5. The metal azo pigments according to claim 1, wherein:
$R^1$ and $R^2$ are OH,
$R^3$ and $R^4$ are =O, and
$R^6$ is hydrogen.

6. The metal azo pigments according to claim 1, wherein:
the metal ions comprise the $Zn^{2+}$ and $Cu^{2+}$ metal ions and the at least one further metal ion Me, where Me is a di- or trivalent metal ion selected from the group consisting of $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, $Ba^{2+}$, and
the amount of $Zn^{2+}$ and $Cu^{2+}$ metal ions together is 95 to less than 100 mol % and the amount of the di- or trivalent metal ions other than $Zn^{2+}$ and $Cu^{2+}$ is up to 5 mol %, based in each case on one mole of all metal ions in the metal azo pigment.

7. The metal azo pigments according to claim 6, wherein the at least one further metal ion Me, is selected from the group consisting of $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, $Y^{3+}$.

8. The metal azo pigments according to claim 1, wherein the amount of $Cu^{2+}$ and $Zn^{2+}$ metal ions together is 100 mol %, based on one mole of all metal ions.

9. The metal azo pigments according to claim 1, wherein 0.05 to 4 mol of compounds of the formula (II) is present per mole of structural units of the formula (I).

10. The metal azo pigments according to claim 1, wherein the pigments have a specific surface area of 20 to 200 $m^2/g$.

11. The metal azo pigments according to claim 1, wherein the pigments produce an x-ray diffractogram wherein, between the interplanar spacings of d=14.7 (±0.3) Å and d=11.8 (±0.3) Å, the x-ray diffractograms have at least one signal S having an intensity I which exceeds the background value by 3 times the square root of this value.

12. A process for producing the metal azo pigments according to claim 1, the process comprising contacting:
a compound of the formula (III), or tautomers thereof,

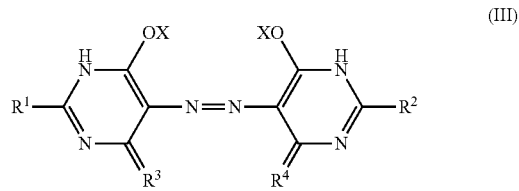

in which
X is an alkali metal ion,
$R^1$ and $R^2$ are each independently OH, $NH_2$ or $NHR^5$,
$R^3$ and $R^4$ are each independently =O or $=NR^5$, and
$R^5$ is hydrogen or alkyl,
with at least one compound of the formula (II)

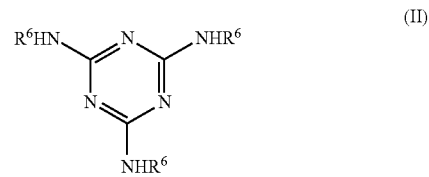

in which $R^6$ is hydrogen or alkyl,
simultaneously or successively with at least one zinc salt and at least one copper salt and optionally with at least one further metal salt of a di- or trivalent metal other than zinc and copper, where 0.06 to 0.995 mol of at least one zinc salt, 0.005 to 0.94 mol of at least one copper salt, and, if used, 0.05 to 0 mol of at least one further metal salt are used per mole of compound of the formula (III), and where the sum total of the molar amounts of these metal salts together is one mole.

13. The process according to claim 12, wherein:
X is a sodium or potassium ion;
$R^5$ is hydrogen or $C_1$-$C_4$-alkyl;
$R^6$ is hydrogen or $C_1$-$C_4$-alkyl, or $C_1$-$C_4$alkyl mono- or polysubstituted by OH, and
the at least one further metal salt of a di- or trivalent metal is selected from the group of $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$ and $Ba^{2+}$ salts.

14. Pigment preparations comprising the at least one metal azo pigment according to claim 1 and at least one auxiliary and/or additive selected from the group consisting of surface-active agents, surface-covering agents, bases and solvents, and optionally at least one further pigment.

15. The pigment preparation according to claim 14, wherein the pigment preparation comprises C.I. Pigment Green 36 and/or C.I. Pigment Green 58.

16. A process for producing a pigment preparation comprising the at least one metal azo pigment according to claim 1, the process comprising mixing and/or grinding the at least one metal azo pigment with at least one auxiliary and/or additive selected from the group consisting of surface-active agents, surface-covering agents, bases and solvents, and optionally with at least one further pigment.

17. A colour filter, photoresist, printing ink or liquid-crystal display comprising the at least one metal azo pigment according to claim 1.

18. A photoresist comprising the at least one metal azo pigment according to claim 1, one or more photocurable monomers, and one or more reaction photoinitiators and optionally one or more binders or dispersants and/or solvents.

19. A process for producing colour filters for liquid-crystal displays with the photoresist according to claim 18, the process comprising a) applying the photoresist to a substrate, b) exposing the photoresist by means of a photomask, c) curing, and d) developing to provide a finished coloured colour filter.

* * * * *